US011598126B2

(12) United States Patent
Miles et al.

(10) Patent No.: US 11,598,126 B2
(45) Date of Patent: Mar. 7, 2023

(54) PRODUCT MERCHANDISING SYSTEMS WITH ENHANCED SECURITY FEATURES

(71) Applicant: Mobile Tech, Inc., Hillsboro, OR (US)

(72) Inventors: Michael D. Miles, Portland, OR (US); Peter Schuft, Portland, OR (US)

(73) Assignee: Mobile Tech, Inc., Hillsboro, OR (US)

( * ) Notice: Subject to any disclaimer, the term of this patent is extended or adjusted under 35 U.S.C. 154(b) by 17 days.

(21) Appl. No.: 17/086,911

(22) Filed: Nov. 2, 2020

(65) Prior Publication Data

US 2021/0131149 A1 May 6, 2021

Related U.S. Application Data

(60) Provisional application No. 62/929,330, filed on Nov. 1, 2019.

(51) Int. Cl.
*E05B 73/00* (2006.01)
*G08B 13/14* (2006.01)
*A47F 5/00* (2006.01)
*A47F 7/00* (2006.01)
*H05K 1/02* (2006.01)

(52) U.S. Cl.
CPC ........ *E05B 73/0017* (2013.01); *A47F 5/0081* (2013.01); *A47F 7/00* (2013.01); *E05B 73/0011* (2013.01); *G08B 13/14* (2013.01); *G08B 13/149* (2013.01); *G08B 13/1445* (2013.01); *G08B 13/1463* (2013.01); *H05K 1/0296* (2013.01)

(58) Field of Classification Search
CPC ............ E05B 73/0017; E05B 73/0011; A47F 5/0081; A47F 7/00; G08B 13/14; G08B 13/1445; G08B 13/1463; G08B 13/149
See application file for complete search history.

(56) References Cited

U.S. PATENT DOCUMENTS

| | | | | |
|---|---|---|---|---|
| 5,886,633 A * | 3/1999 | Adams | ............... | G08B 13/1463 340/687 |
| 6,956,479 B2 * | 10/2005 | Kelsch | ................. | G08B 13/149 340/568.4 |
| 7,774,969 B1 * | 8/2010 | Silverman | ............... | G09F 3/207 40/586 |
| 8,278,948 B2 * | 10/2012 | Johnson | ................... | G01R 1/10 340/568.1 |
| 10,464,780 B2 * | 11/2019 | Wheeler | ............. | E05B 73/0011 |
| 10,706,694 B2 * | 7/2020 | Allison | ............... | G08B 13/1445 |
| 2011/0309934 A1 * | 12/2011 | Henson | .............. | G08B 13/1472 340/568.8 |
| 2020/0399933 A1 * | 12/2020 | Kelsch | .................. | E05B 35/008 |

* cited by examiner

*Primary Examiner* — John A Tweel, Jr.

(57) ABSTRACT

This disclosure is directed to product merchandising systems that are designed to prevent brute force attempts to steal a product on display. The merchandising systems include security features that enhances the strength of the connection between a puck assembly and a base assembly and between the base assembly and a display surface. The merchandising systems are suited for withstanding brute force pulling attacks on the puck assembly and the base assembly.

15 Claims, 34 Drawing Sheets

--PRIOR ART--

--PRIOR ART--

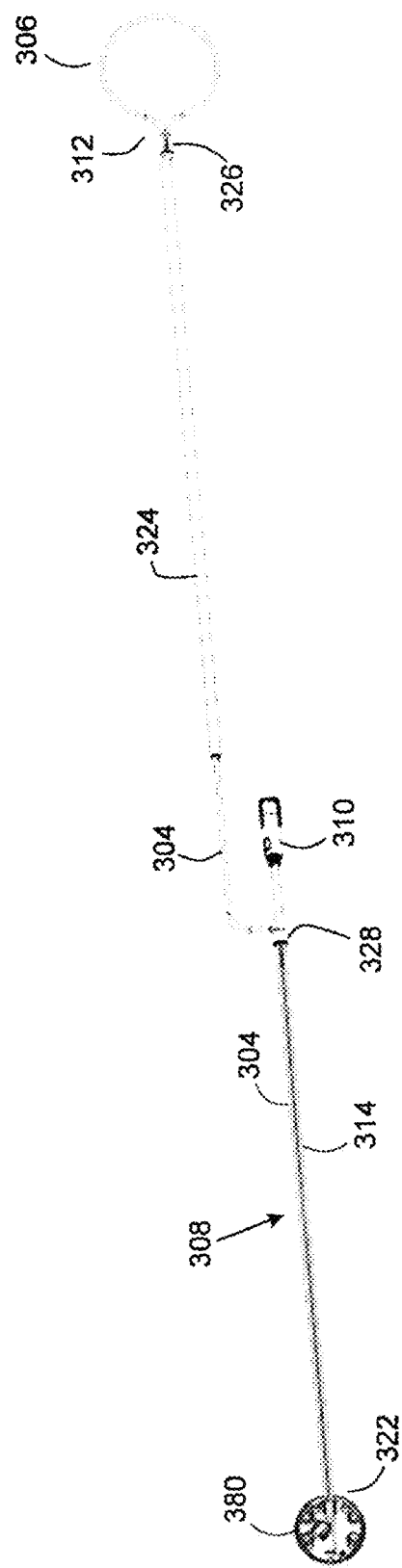

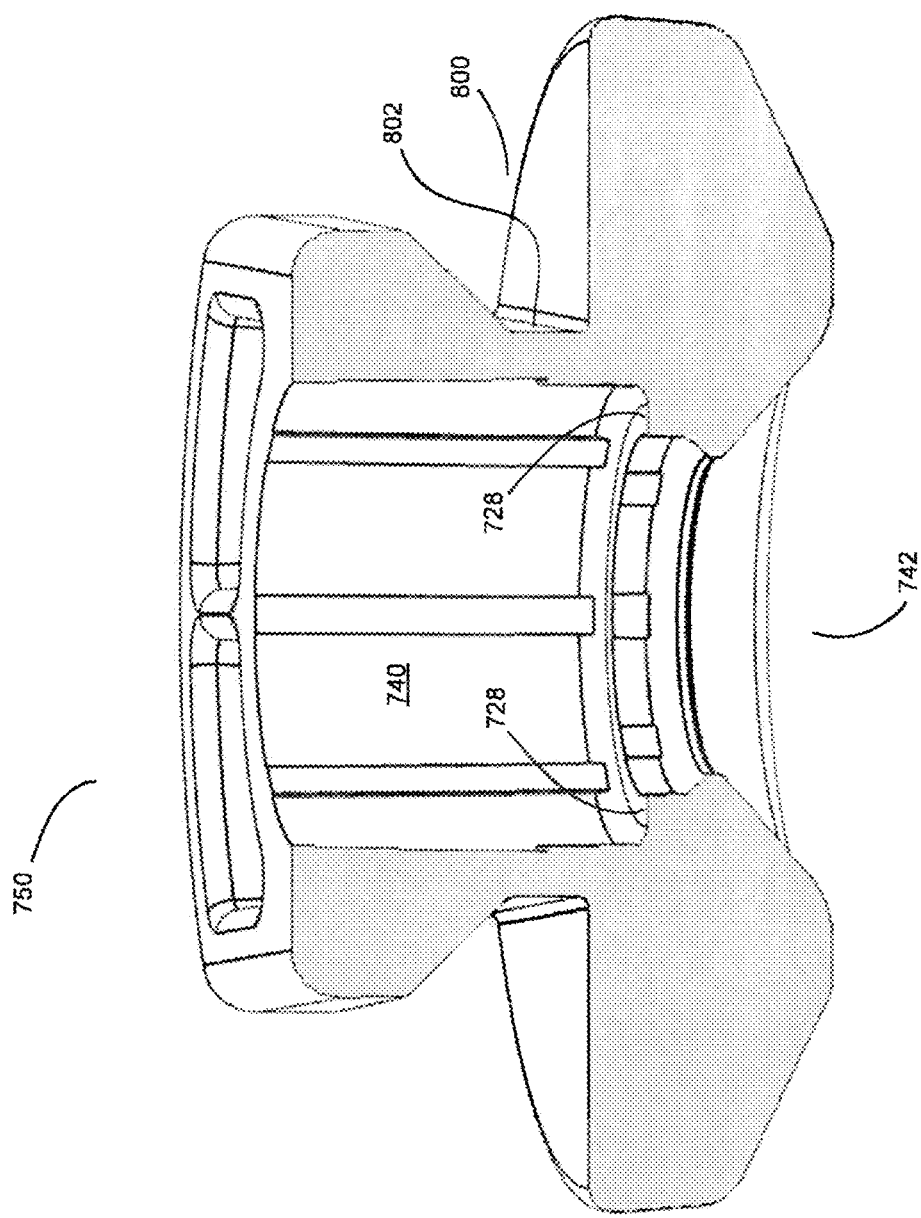

PRODUCT MERCHANDISING SYSTEMS WITH ENHANCED SECURITY FEATURES

CROSS-REFERENCE TO RELATED APPLICATION

This application claims priority to Provisional Application No. 62/929,330, filed Nov. 1, 2019.

TECHNICAL FIELD

The present disclosure is directed to securing systems for merchandising electronic devices.

BACKGROUND

Products are often merchandised to customers using merchandising systems that are designed and constructed to prevent theft of the products on display. FIGS. 1A and 1B show examples of a product display assembly 100 that includes a puck assembly 102 and a base assembly 104. The base assembly 104 can be secured to a display table or a shelf. A tether 110 connects the puck assembly 102 to the base assembly 104. A product such as an electronic device 106 is mounted on a top or upper surface of the puck assembly 102 so that the electronic device 106 can be securely displayed to customers in a store. The electronic device 106 may be a smart phone, a tablet computer, a camera, or a wearable device (e.g., smart watches). The puck assembly 102 is moveable between a rest position shown in FIG. 1A and a lift position shown in FIG. 1B. FIG. 1B also shows how the tether 110 connects the puck assembly 102 to the base assembly 104 when the puck assembly 102 is in the lift position. The tether 110 allows a customer to pick up, hold, and inspect the electronic device. To provide ease of handling, the tether 110 may be a retractable tether that is included as part of a retractable tether assembly.

However, typical display assemblies are unable to resist brute force attempts to steal a product on display. Such attempts include breaking a connection between the puck assembly 102 and the tether 110, breaking a connection between the tether 110 and base assembly 104, and/or breaking a connection between the base assembly 104 and display surface. In one example, a thief grabs the puck assembly 102 and pulls on the puck assembly 102 in an attempt to tear the puck assembly 102 away from the base assembly 104. While pulling on the puck assembly 102, the thief may also apply twisting and shearing forces to the puck assembly 102 and the tether 110. In another example, a thief grabs the base assembly 104 and applies strong pulling, twisting, and/or shearing forces to the base assembly 104 in an attempt to sever a connection between the base assembly 104 and the display surface. Through such brute force attacks, the connection between the puck assembly 102 and the tether 110, the connection between the tether 110 and the base assembly 104, and/or the connection between the base assembly 104 and the display surface may be broken, enabling the thief to make off with the product.

SUMMARY

This disclosure is directed to product merchandising systems that are designed to prevent brute force attempts to steal a product on display. The merchandising systems include security features that enhances the strength of the connection between a puck assembly and a base assembly and between the base assembly and a display surface. In one aspect, a merchandising system includes an anchoring tether having a first end and a second end. The first end has a compression-fit connector. The second end is connectable to an anchor. The base assembly has a base plate with a retainer that securely holds the connector and has a recess for passage of the anchoring tether and a power cable. In another aspect, a base assembly of a merchandising system includes an interior metal frame formed from a plurality of metal members and a metal base plate joined to the metal members. The plurality of metal members and metal base plate form a metal frame recess. The base assembly includes a tether assembly for connection to the puck assembly. The tether assembly is securely retained within the metal frame recess. The merchandising systems are suited for withstanding brute force pulling attacks on the puck assembly and the base assembly.

DESCRIPTION OF THE DRAWINGS

FIGS. 3A-3B show an example base assembly with an example anchoring tether.

FIGS. 8A-8E show various views of an example puck fitting.

DETAILED DESCRIPTION

Figure 1A:
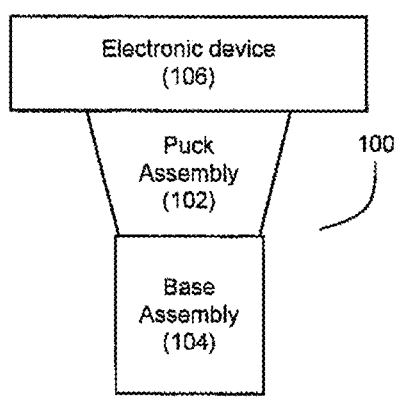
FIGS. 1A and 1B shows an example product display assembly.
Figure 1B:
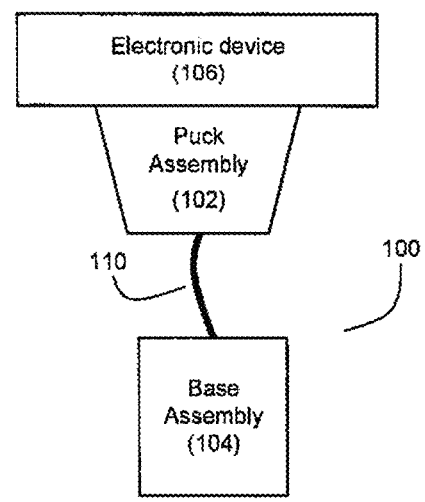
Figure 2A:
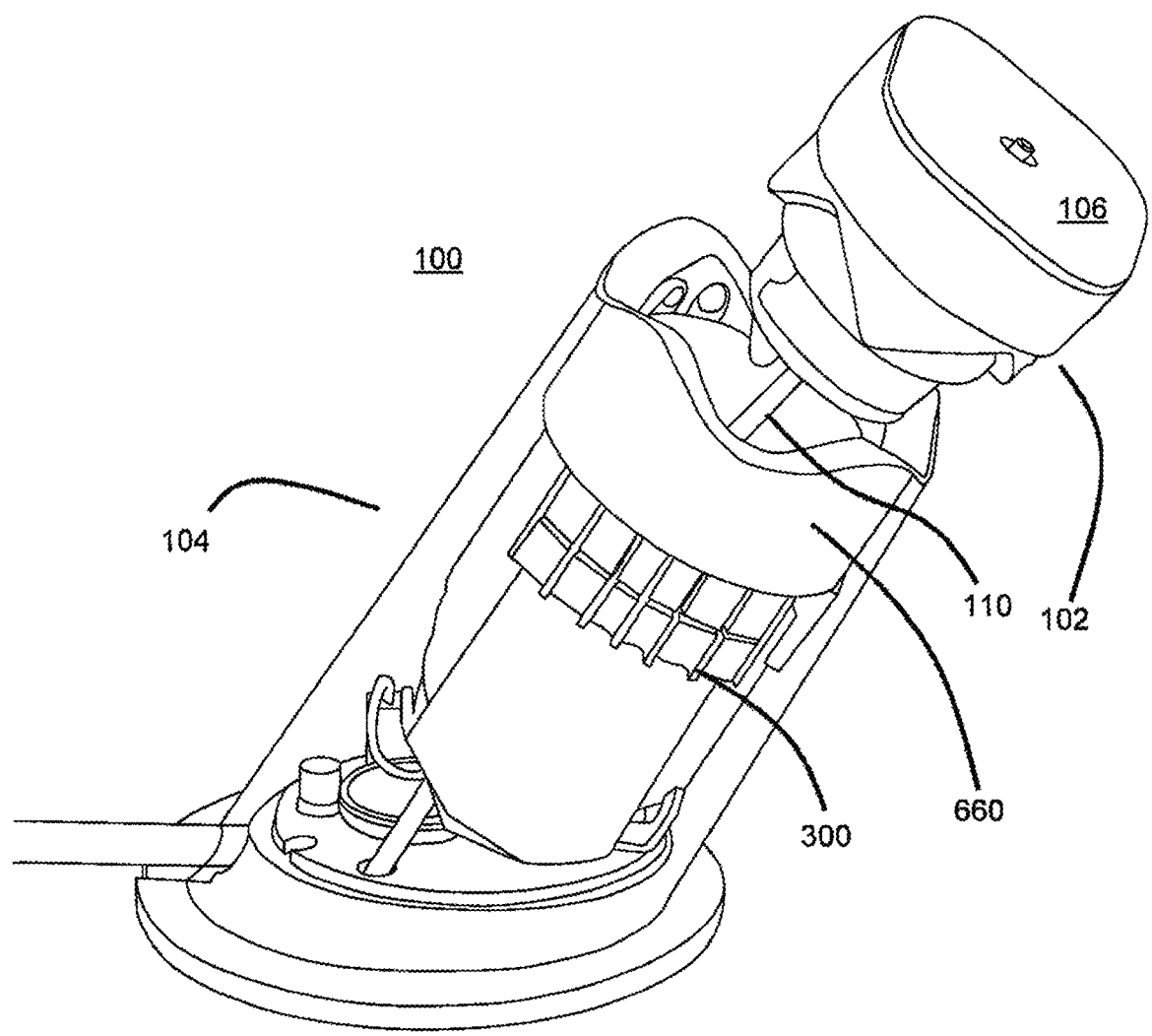
FIG. 2A shows example product display assembly that includes enhanced security features.
Figure 2B:
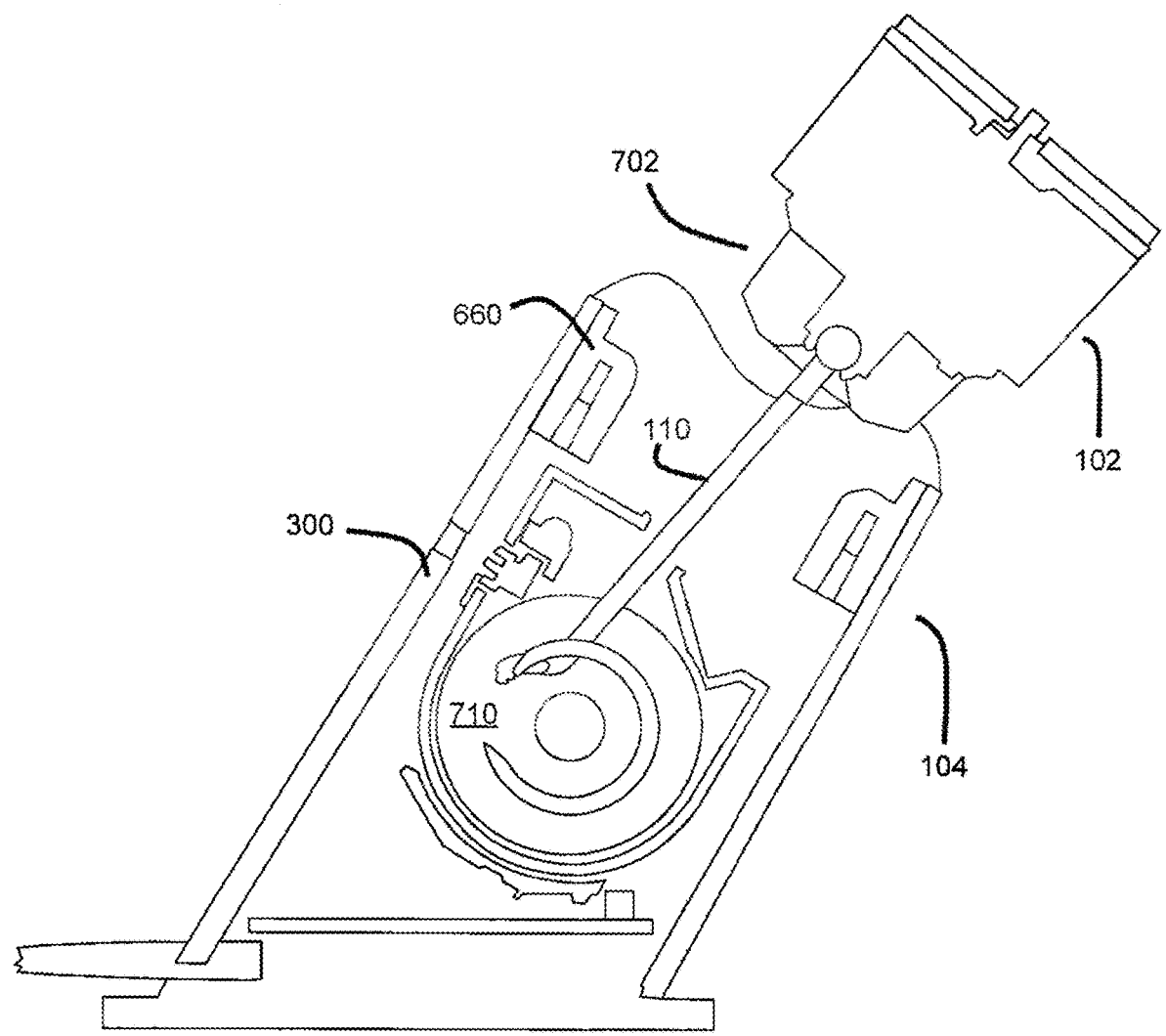
FIG. 2B shows a cross-sectional view of the product display assembly of FIG. 2A.

FIGS. 2A-2B show a product display assembly 100 with enhanced ability to remain intact in the event of a brute force attack where a thief applies strong pulling forces on the puck assembly 102 and/or base assembly 104. FIG. 2A shows an example view of an enhanced security product display assembly 100 where the puck assembly 102 is in a lift position relative to the base assembly 104. A tether 110 connects the puck assembly 102 and base assembly 104 and can be seen when the puck assembly 102 is in the lift position. FIG. 2B shows a cross-sectional view of FIG. 2A. FIGS. 2A and 2B show the base assembly 104 includes a riser 300 and a riser cup 660 that are joined together as discussed below. Riser cup 660 can include a recess that allows for the seating of a lower portion of the puck assembly 102 when the puck assembly 102 is in the rest position on the base assembly 104. Riser 300 can include various structural components that enhance the strength and rigidity of the product display assembly 100, as discussed below.

For a frame of reference in the discussions below with respect to various components of the disclosed example embodiments for a product display assembly 100. it should be understood that terms such as "upper", "top", "higher", "upward", and the like will refer to a directional relationship that is toward the mounting surface 106 of the puck assembly 102, while terms such as "lower", "bottom", "downward", and the like will refer to a directional relationship that is toward the base assembly 104. Length would thus refer to the dimension from an upper portion to a lower portion, and width would refer to the lateral dimension that is orthogonal to the length dimension. Similarly, "vertical" refers to the length dimension for a product display assembly 100 and "horizontal" refers to the width dimension for the product display assembly 100, even if the product display assembly 100 is displayed at a tilted angle (such as shown by FIG. 2).

Figure 3A:
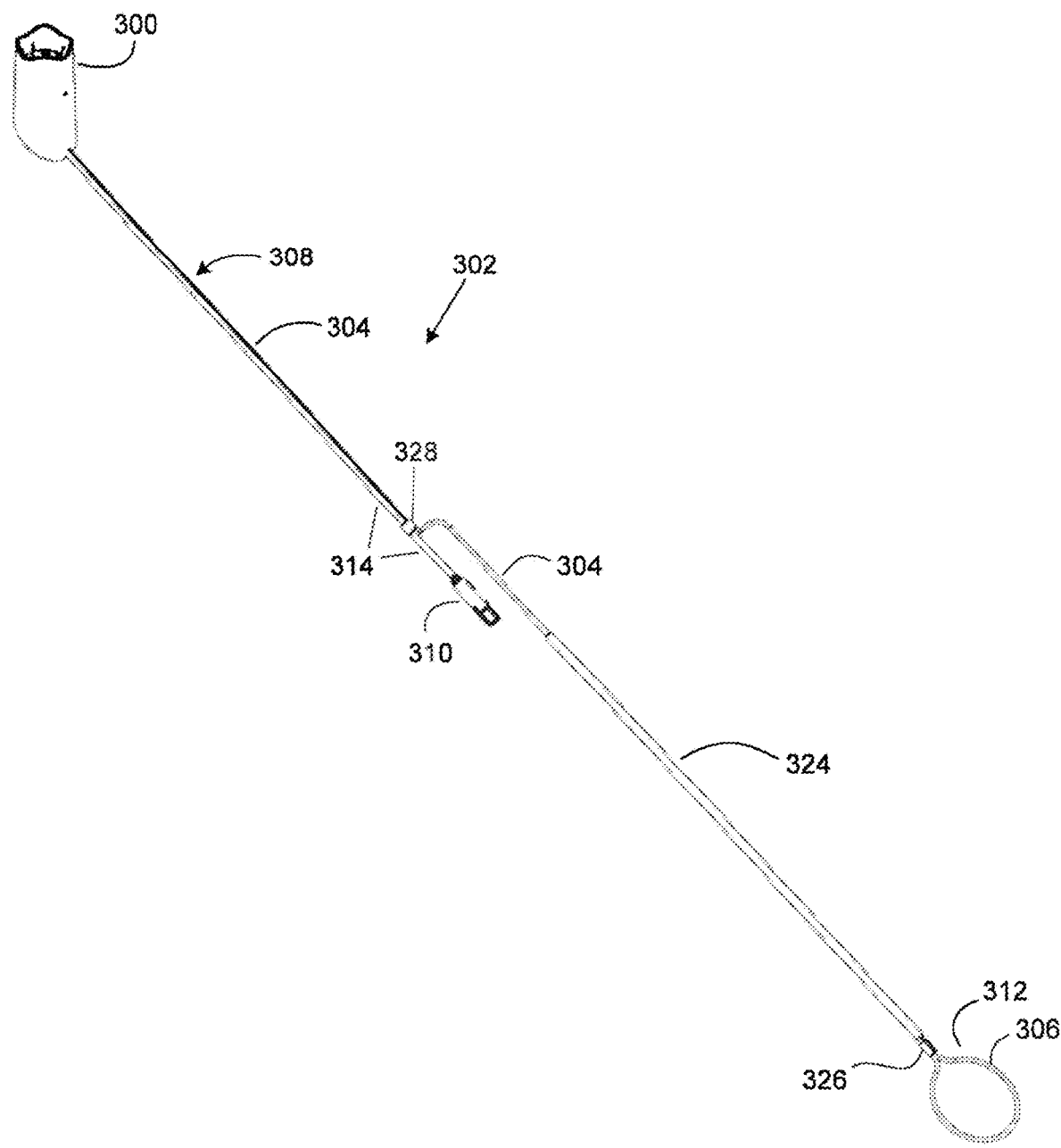

One of the potential connection losses that can result from a brute force attack by thieves is a disconnection of the entire product display assembly 100 from a display surface such as a display table. To reduce the risk of such thefts, FIGS. 3A and 3B show views of an example embodiment of an anchoring system 302 that can be employed to better anchor the product display assembly 100. FIG. 3A shows the riser 300 of the base assembly 104 connected to an anchoring tether 304. One end portion of the anchoring tether 304 can be connected to the base assembly 104. while the other end portion of the anchoring tether 304 can be connected to an anchor that is secured to the floor, display table, or other heavy, relatively unportable object as described below with reference to FIGS. 3C-3F. The anchoring tether 304 can be a flexible cable formed of a high strength material such as a steel cable. For example, the anchoring tether 304 can take the form of a stranding structure of stainless-steel cable (e.g., a 19×7 stranding structure of stainless-steel cable) with an outside diameter of about 2.0 mm. The tensile strength of the anchoring tether 304 can be approximately 900 lbs. However, it should be understood that the anchoring tether 304 may be composed of other materials, configurations, diameters, and tensile strengths. In the example of FIGS. 3A and 3B, a loop 306 is formed in one end of the anchoring tether 304. The loop 306 is formed by crimping an end of the anchoring tether 304 to an upper part of the anchoring tether 304 via a crimp structure 326 while leaving an opening that defines the loop 306. However, it should be understood that other connectors may be used, such as a locking connector secured to tether end portion 312 via crimping or the like. A portion of the anchoring system 302 can also include a sheath 324 that surrounds an axially-extending portion of the anchoring tether 304 as shown in FIGS. 3A and 3B. By securing the product display assembly 100 to the anchor via the anchoring tether 304, the product display assembly 100 can better resist brute force attacks.

FIGS. 3A and 3B also show the anchoring tether 304 bundled with a power cable 314 as part of a power distribution and anchoring system 302. The power cable 314 may include multiple conductors for powering the product display assembly 100. Anchoring system 302 can include a bundle 308 where power cable 314 and anchoring tether 304 are commonly sheathed along a portion of their axial lengths. The power cable 314 can terminate at a circuit board in the base assembly 104 and terminate at its opposite end with an electrical connector 310 for connection to a power source. Bundle 308 may include a sheath that surrounds the anchoring tether 304 and the power cable 314. A ring 328 may be located near the point of the assembly where the anchoring tether 304 and power cable 314 diverge.

Figure 3C:
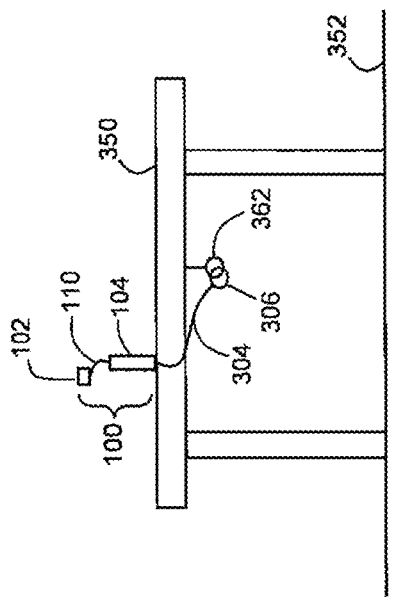
FIGS. 3C-3F show examples of anchoring a product display assembly.

FIG. 3C shows an example arrangement where the base assembly 104 is secured to a floor anchor 360 via the anchoring tether 304. The product display assembly 100 can be located on a display table 350, while floor anchor 360 is secured to the floor 352 as shown by FIG. 3C. When a thief applies strong pulling, shearing, and/or twisting to the puck assembly 102 and/or base assembly 104, the anchoring tether 104 can keep the product display assembly 100 from being removed from a retail store or the like because the connection between the product display assembly 100 and the floor anchor 360 is maintained. Accordingly, even if the product display assembly 100 itself becomes dislocated from the display table 350, the product display assembly 100 remains anchored to the floor 352.

Figure 3D:
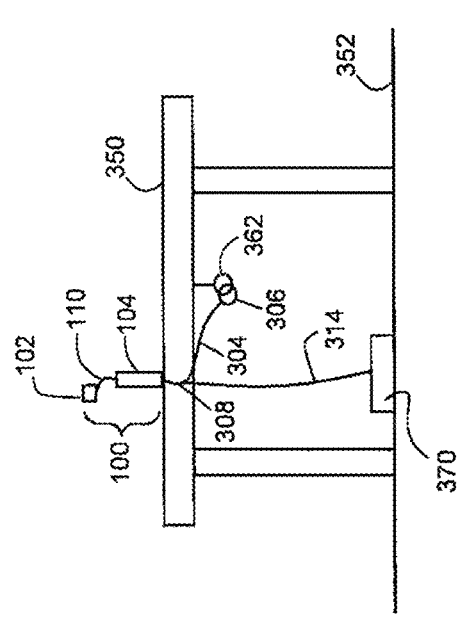

FIG. 3D shows another example arrangement, in this case where the base assembly 104 is secured to a table anchor 362 via the anchoring tether 304. In this example, the table anchor 362 is secured to display table 350, such as the underside of the display table 350. Like the example of FIG. 3C, when a thief applies strong pulling, shearing. and/or twisting to the puck assembly 102 and/or base assembly 104, the anchoring tether 304 can keep the product display assembly 100 from being removed from a retail store or the like because the connection between the product display assembly 100 and table anchor 362 can be maintained (even if the product display assembly 100 itself becomes dislocated from the display table 350). Similarly, anchor need not be limited to being located on the floor or the display table. For example, the anchor may be located in a wall or other heavy, unportable object.

In examples where connector is a loop 306, the anchor 360/362 can take a form such as a hook for connection with the loop 306. For example, the anchor 360/362 can be a locking hook, such as a high strength locking hook (e.g., formed from metal such as stainless steel or the like).

Figure 3E:
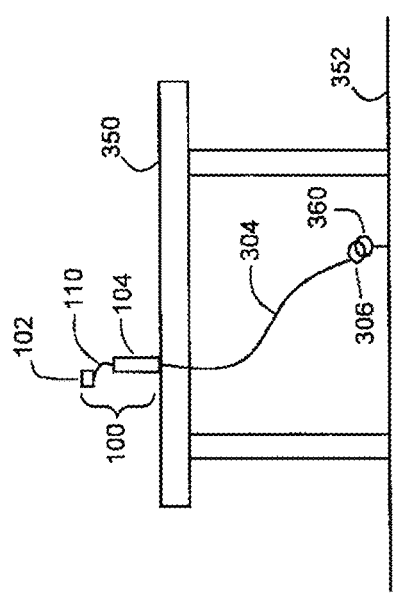
Figure 3F:
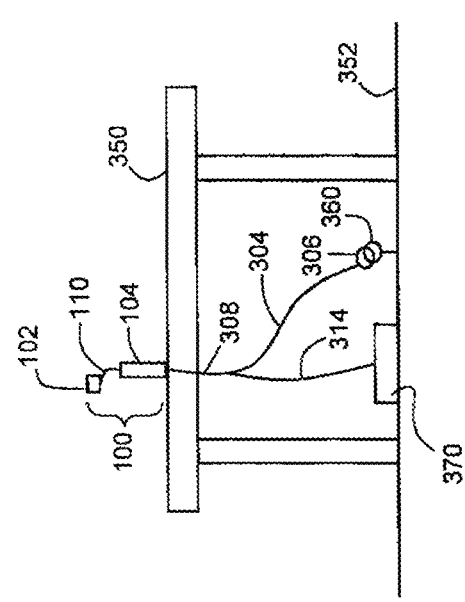

FIGS. 3E and 3F show a bundle 308 in which the power cable 314 and the anchoring tether 304 are commonly sheathed along a portion of their axial lengths. The power cable 314 is connected to a power source 370 in FIGS. 3E and 3F. The power source 370 may take the form of a power strip, wall outlet, or floor outlet. The anchoring tether 304 can terminate at one of its end portions 322 in a connection to the base assembly and can also terminate at its opposite end portion 312 in a connector 306 for connection with the anchor 360/362.

The anchoring tether 304 can have a length that provides an amount of sag when the product display assembly 100 is in a normal display position on a display table 350. in which case the anchoring tether 304 would only be tensioned in the event that the product display assembly 100 is removed from the display table 350.

Figure 4:
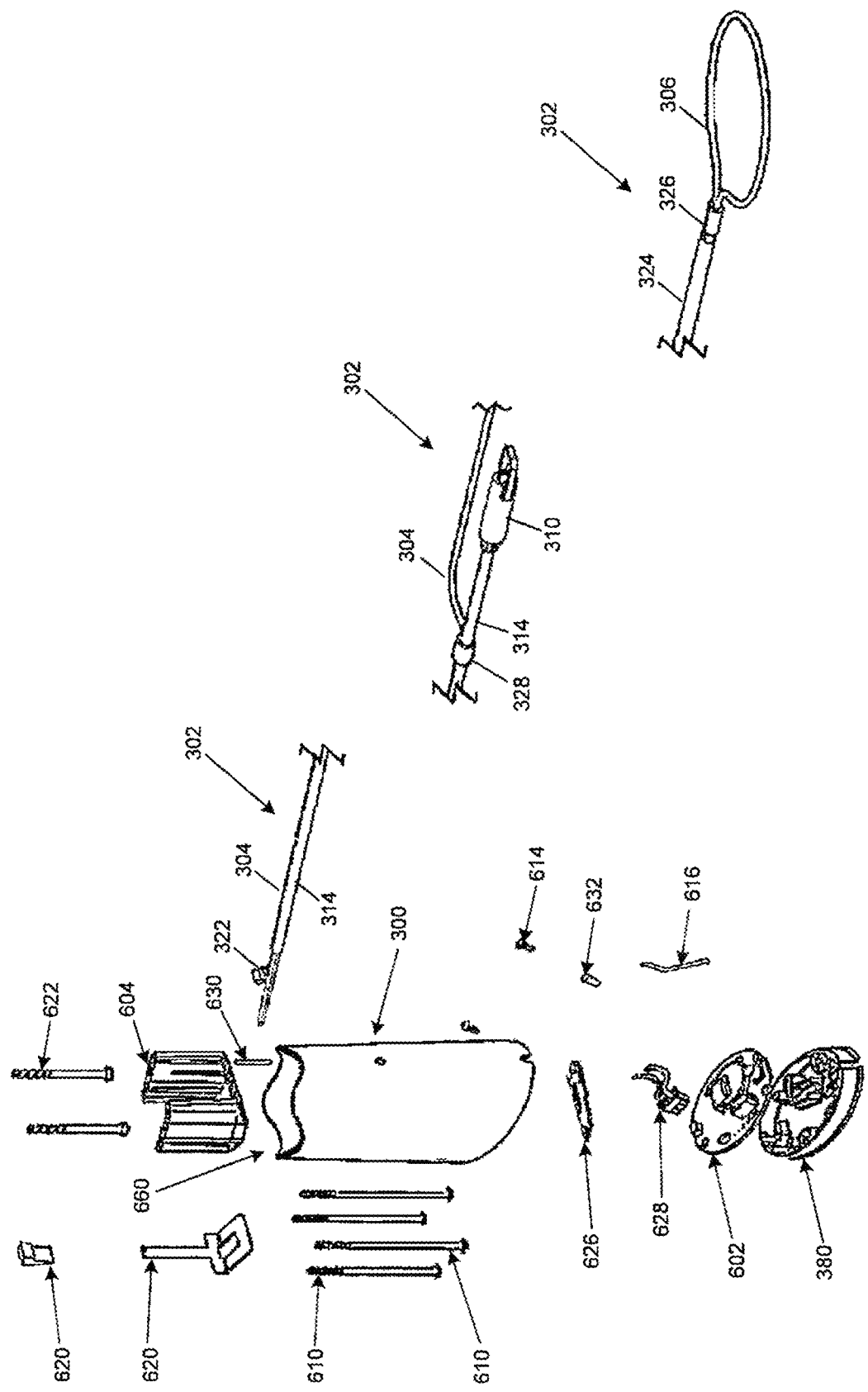
FIG. 4 shows an exploded view of an example base assembly with the anchoring tether shown by FIGS. 3A and 3B.

FIG. 4 shows an exploded view of the riser 300, power distribution, and anchoring assembly 302. The riser 300 may include a number of components such as those discussed below with reference to FIGS. 6A-6H. These components can include an electrical cable assembly (ECA) interface 626 that makes connections from ECA/circuit board 602 in the riser 300 to an ECA/circuit board in the riser cup 660 (see discussions below). Connector 628 connects three conductors to the circuit board 602. Two of the conductors supply power and third conductor is for ground. Conductor 616 can connect the circuit board 602 to a tether assembly (shown in FIG. 7A) as part of a continuity circuit for detecting tether cuts. Plunger 632 can be a plastic pin or the like whose position communicates the presence or absence of a mounting surface to a sensor switch located on the circuit board 602. If the riser 300 is mounted firmly in place, plunger 632 is displaced upward to depress the switch and circuitry in the circuit board 602 concludes that there is no need for an alarm based on removal of the base assembly 104 from a display surface such as a display table. But, if base assembly 104 is torn away from the display surface during a theft, the plunger 632 is displaced from the sensor switch and the circuit board 602 triggers an alarm.

As shown in FIG. 4, the product display assembly 100 includes a base plate 380 located at the bottom of the riser 300. The anchoring tether 304 connects to the base plate 380 at end portion 322 of the anchoring tether 304. Accordingly, if a thief dislocates the product display assembly 100 from a display table 350 and pulls on the product display assembly 100 to create tension in the anchoring tether 304, the force stack/chain will include the connection between anchoring tether 304 and base plate 380, the anchoring tether 304 itself, and the connection between anchoring tether 304 and anchor 360/362 (as well as the connection between anchor 360/362 and the floor 352) or table 350 (or wall or other suitable unportable object).

Figure 5A:
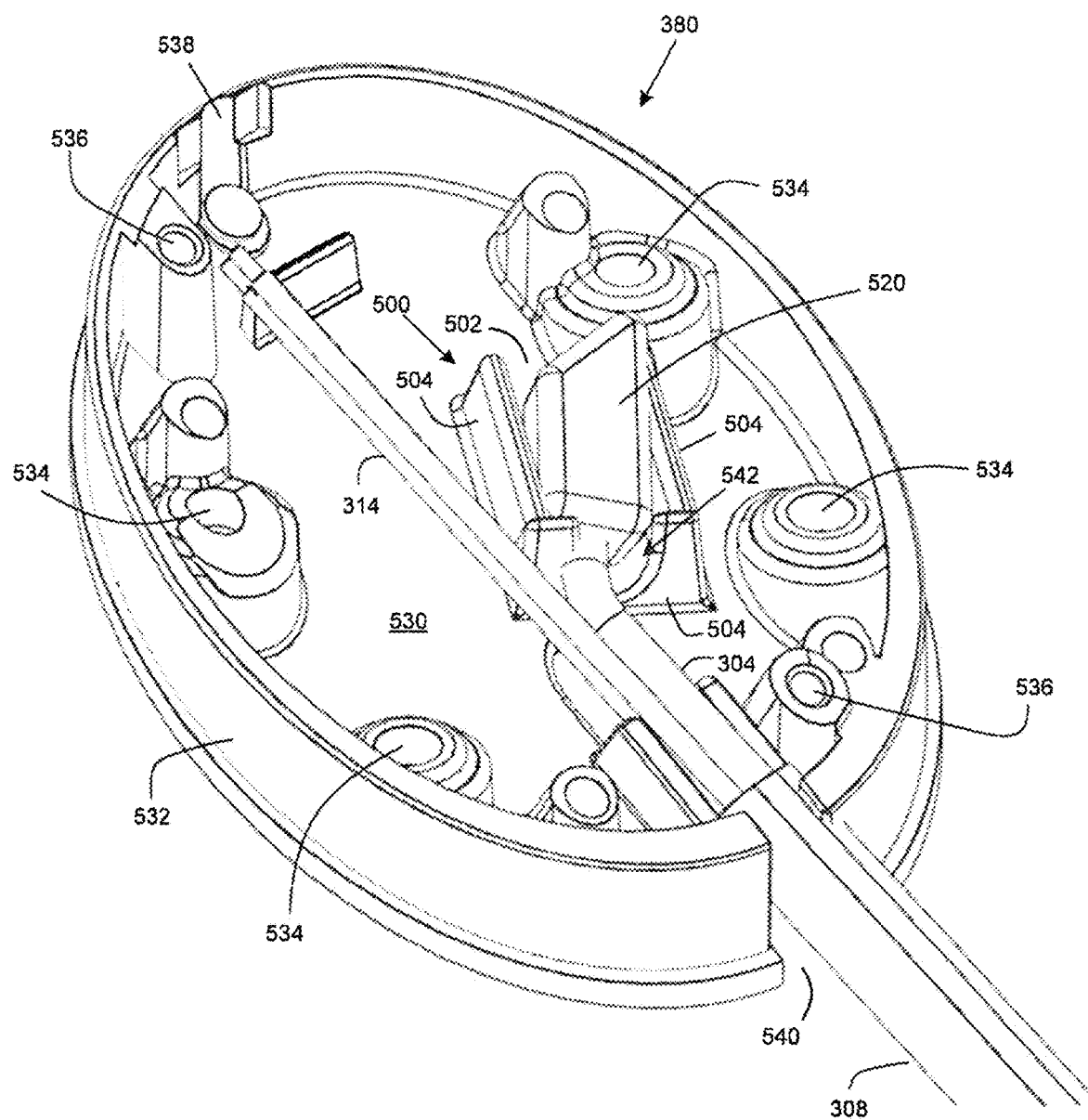
FIG. 5A is a perspective view of an example base plate of the base assembly connected with an anchoring tether.
Figure 5B:
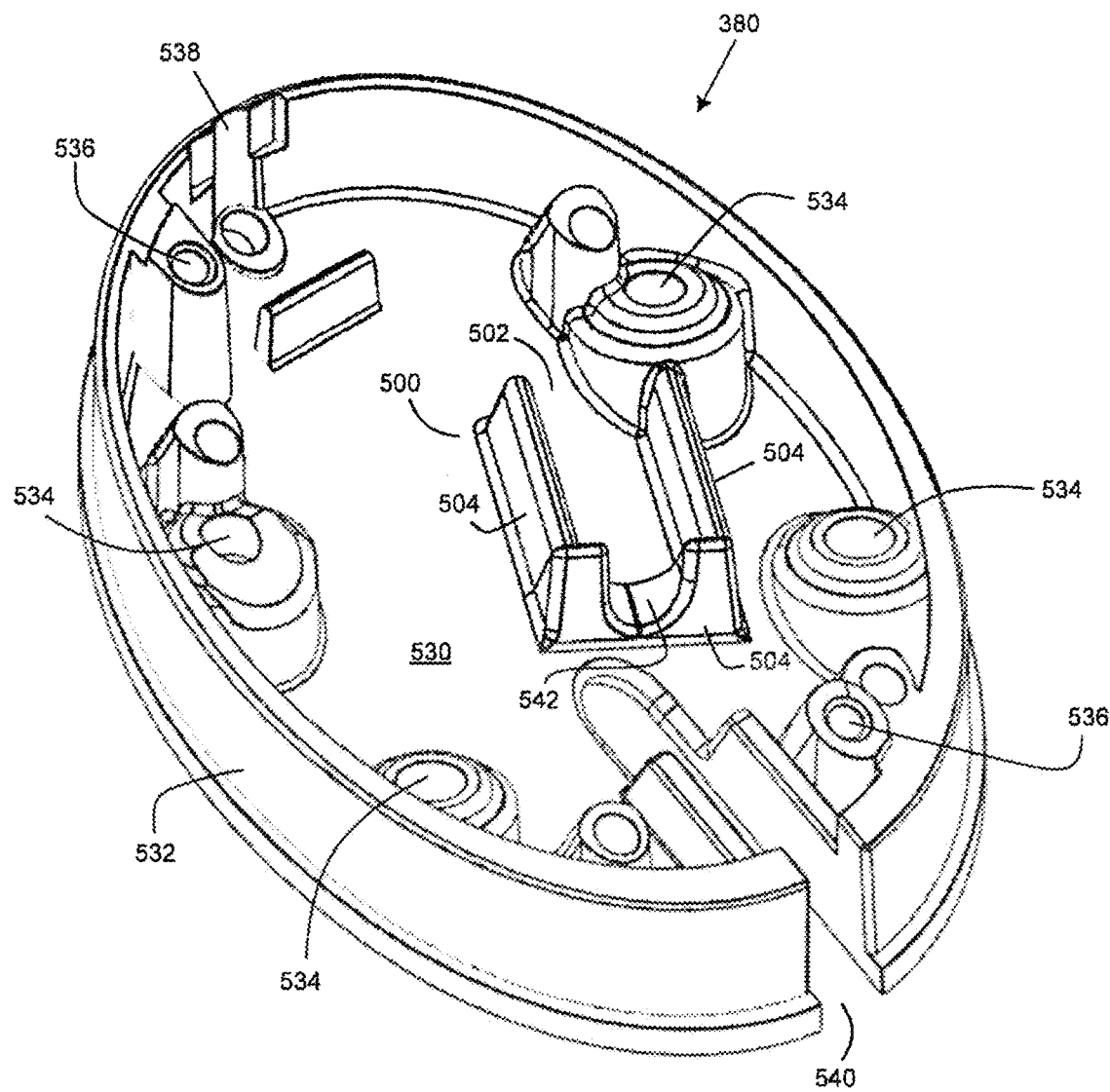
FIG. 5B is a perspective view of the base plate shown in FIG. 5A without the anchoring tether.
Figure 5C:
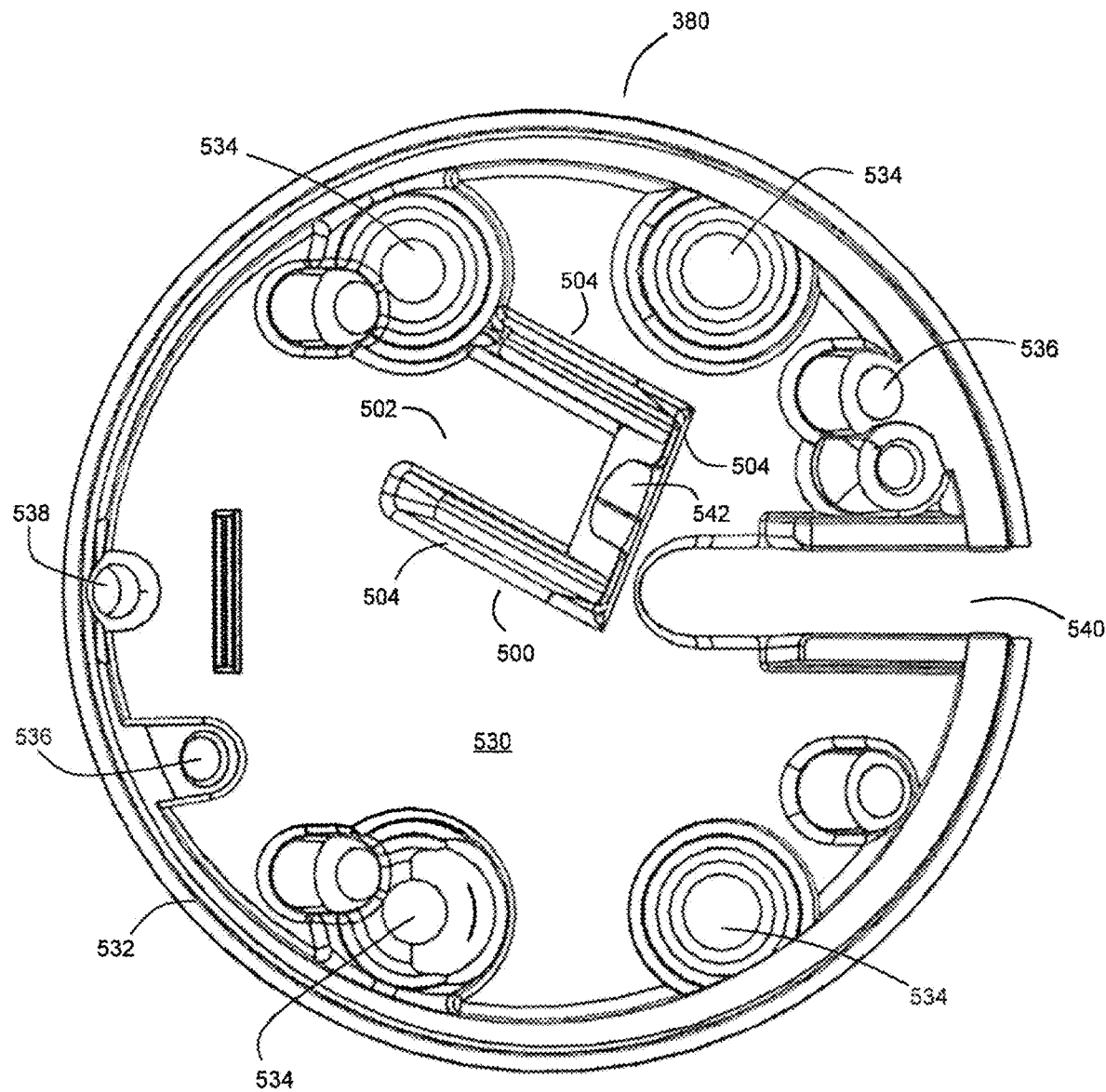
FIG. 5C is a top view of the base plate shown in FIGS. 5A and 5B.

FIGS. 5A-5C show different views of the base plate 380. The base plate 380 can be formed from a metal such as aluminum, zinc alloys, or steel (e.g., stainless steel) with suitable robustness and rigidity. As an example, the base plate 380 can be made of a die-cast aluminum such as the alloy ADC12 (also known as A383 or 46000). The base plate 380 includes a floor 530 in the shape of a metal disk. The base plate may also include a vertical portion 532 that extends upward around a periphery of the floor 530 to define a recessed interior for an upper surface of the base plate 380.

An opening 540 in the vertical portion 532 and/or floor 530 permits passage of the anchoring tether 304 and power cable 314. Base plate 380 includes a retainer 500 that can be formed of metal such as aluminum, steel, or an alloy. The retainer 500 is located on a floor 530 of the base plate 380 inside the base plate periphery. The retainer 500 is shaped to hold secure connector 520 located at the end a the anchoring tether 304 to prevent anchoring tether 304 from being dislocated from the base assembly 104. In the example of FIG. 5A, the retainer 500 can include a recess 502 that receives the connector 520. The recess 502 is formed by three side walls 504 that rise from the floor 530. As shown in FIGS. 5B and 5C, two side walls 504 hold the connector 520 and a third side wall includes a recess 542 that allows passage of the anchoring tether 304. Connector 520 can be secured to end portion 322 of the anchoring tether 304 using compression fitting. The connector 520 exhibit dimensions that are larger than the diameter of the cable of the anchoring tether 304 (and recess 542). In the example of FIG. 5A, the connector 520 can be a trapezoidal-shaped block that fits within the recess 502 of the retainer 500. The wall 504 can include an opening 542 through which part of the end portion 322 of anchoring tether 304 is inserted and secured via compression fit, welding, or other techniques.

The bottom of the base plate 380 can serve as a bottom surface of the base assembly 104. Base plate 380 may be secured to a display table 350 when setting up a product display assembly 100 in any of a number of fashions. For example, the base plate 380 could be screw-mounted to the display table 350. As another example, the base plate 380 could be adhesively attached to the display table 350 via an epoxy or glue that is applied to a bottom surface of the base plate 380. The base plate 380 may be attached to the display table 350 in a manner that provides a breakaway connection for the product display assembly 100 from the display table 350 without causing undue damage to the display table 350. Given that display tables 350 are often expensive items of furniture, the product display assembly 100 may break away from the display table 350 relatively easily when a thief applies force, in which case the anchoring tether 304 will operate to prevent removal of the product display assembly 100 from a retail store. Such a breakaway connection may be achieved by using an epoxy applied to the bottom surface of base plate 380, where the epoxy is sufficiently sticky to provide a stable connection for normal use of the product display assembly 100 on the display table 350 but not so strong as to cause damage to the display table 350 should the product display assembly 100 be pulled or ripped away with a large force.

FIGS. 5A-5C also show openings 534 that can be included in the base plate 380 for receiving portions of a metal frame that can be employed to further strengthen the product display assembly higher up in the force stack/chain. For example, the metal frame may include vertical members that extend through openings 534 and connect with the base plate 380. FIG. 6C shows an example of such a metal frame where the vertical members are metal fasteners 610. The fastener 610 are inserted through the openings 534 at the bottom surface of the base plate 380, and where their upper ends are threaded for attachment to corresponding threads that are part of a riser sleeve 600.

FIGS. 5A-5C also show openings 536 that can be included in the base plate 380 for receiving fasteners that secure a circuit board 602 (see FIG. 6B) within the base assembly 104. The interior of the upper surface of the base plate 380 may also include space for accommodating an end portion of the power cable 314 and a terminal 538 that connects with the wire of the power cable 314. The terminal 538 pass electrical current to the circuit board 602 in order to provide power to the circuit board 602.

Figure 6A:
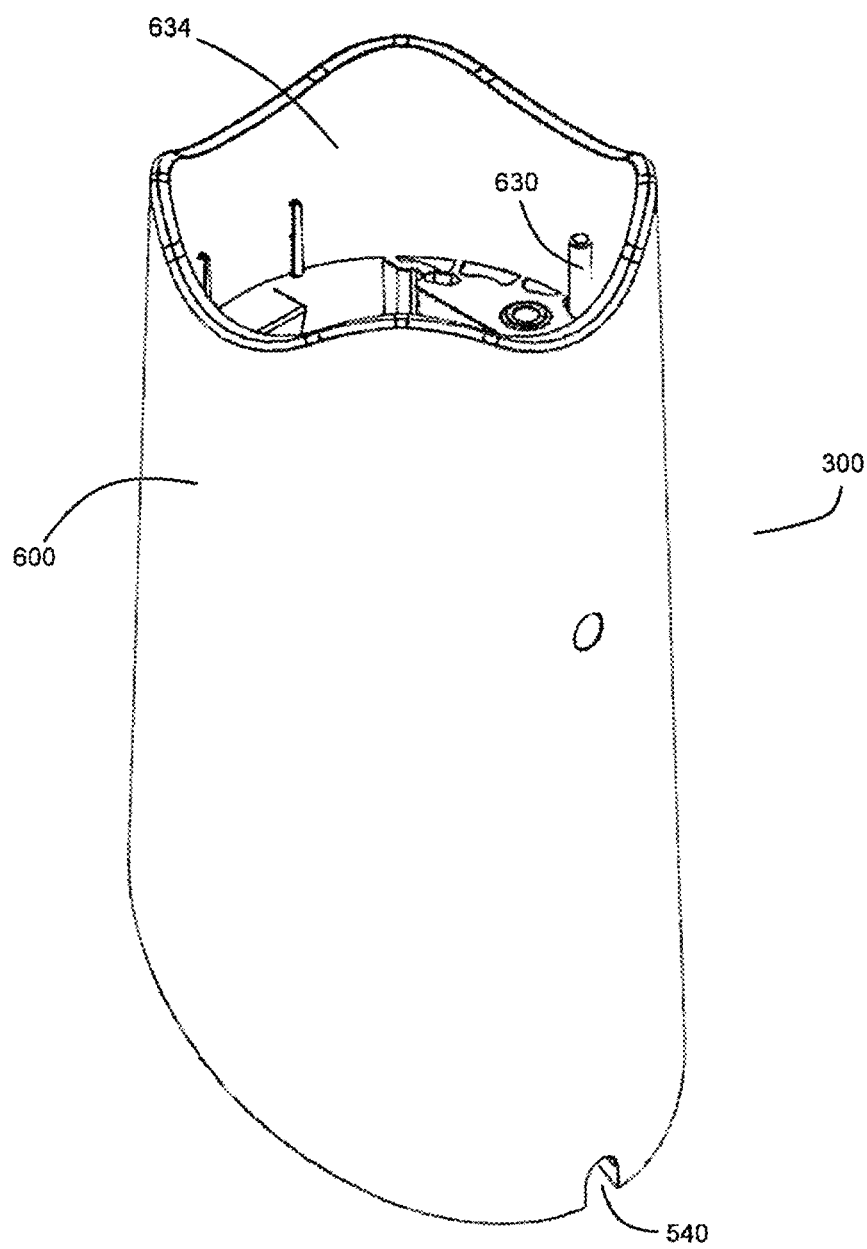
FIG. 6A shows an example riser of the base assembly.

FIG. 6A shows the riser 300 with a riser sleeve 600 that encloses interior components of the riser 300. Riser sleeve 600 can be largely decorative and need not play any significant role in the force stack; chain of the product display assembly 100. As such, riser sleeve 600 can be formed from a lightweight material such as plastic that need not necessarily be capable of withstanding strong forces. The upper portion of the riser 300 defines a recess 634 that is shaped to receive riser cup 660. A rod 630 can extend upward into the recess 634 from the riser sleeve 600 (or from another component of the riser 300) to provide a keying function for properly aligning the riser cup 660 with the riser 300 when joining the two together. Accordingly, the bottom surface of riser cup 660 can include a recess for receiving the extending portion of rod 630 when riser cup 660 is properly aligned with the riser 300. In the example of FIG. 6A, rod 630 can take the form of a plastic rod-shaped component.

Figure 6B:
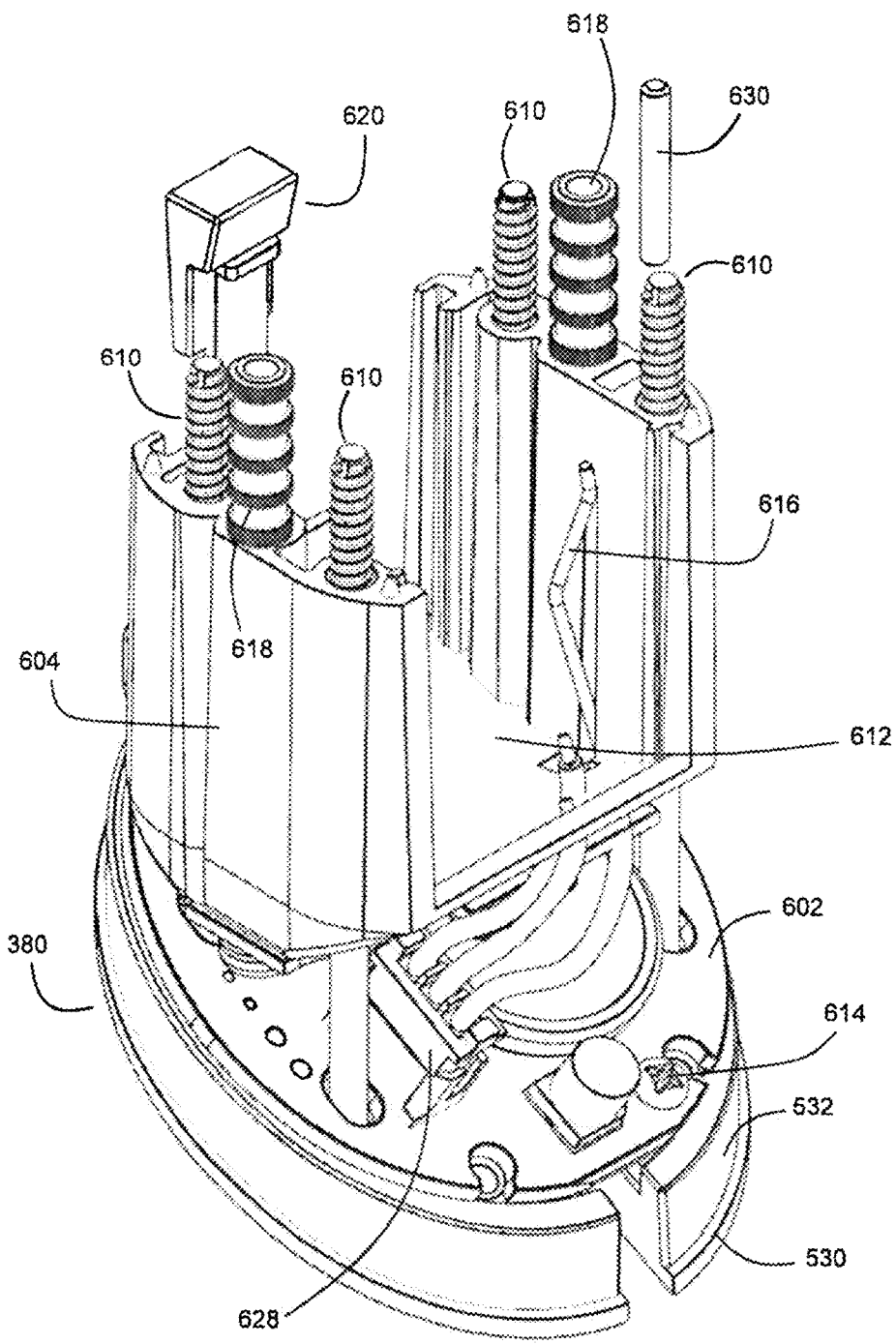
FIG. 6B shows the riser of FIG. 6A with a riser sleeve omitted.
Figure 6C:
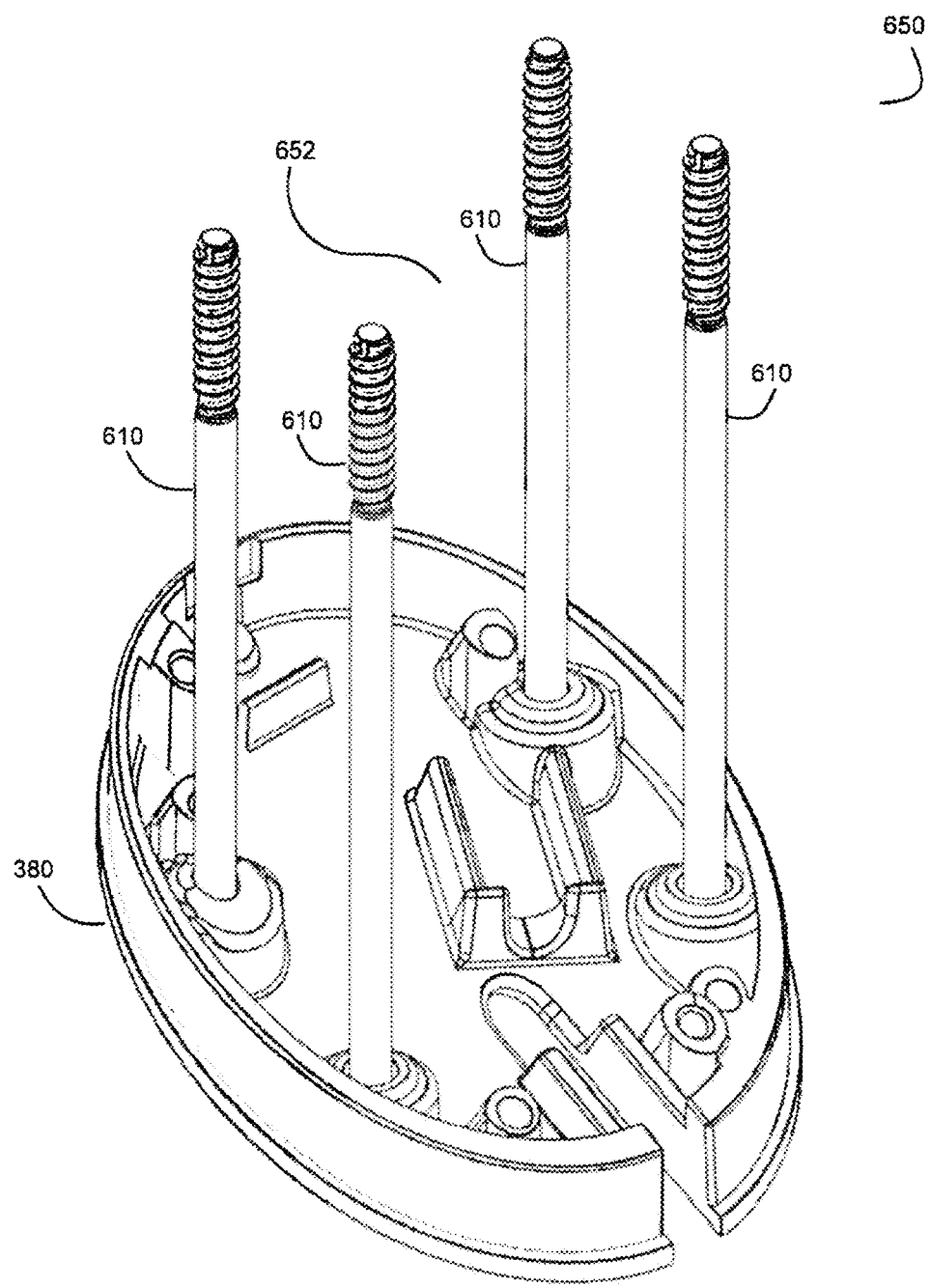
FIG. 6C shows an example metal frame portion of the base assembly.

FIG. 6B shows the riser 300 with the riser sleeve 600 removed in order to reveal the components shown in exploded view of FIG. 4 assembled for use. FIG. 6C shows the riser 300 of FIG. 6B as reduced to a metal frame that serves as the force chain/stack of the product display assembly 100. As shown in FIG. 6C, the force stack/chain includes a metal frame 650 formed by the base plate 380 and four metal fasteners 610. In other implementations, the metal frame 650 may have more than four metal fasteners. For example, a single vertical member joined with the metal base plate 380 may be sufficient for a given application. However, in other instances, it may be desirable to employ two, three, five or more metal fasteners. Metal frame 650 includes an opening 652. As shown in 6B, the riser 300 includes a holder 604 for a tether assembly 700 shown in FIG. 7A. The holder 604 may be formed from a lightweight material such as plastic. In the example of FIG. 6B, the holder 604 comprises two towers or sidewalls separated by a recess 612. Each tower includes two openings that allow passage of two of the metal fasteners 610. The reel housing 704 of the tether assembly 700 described below fits within the recess 612, which is located within the metal frame recess 652 during operational use of the product display assembly 100.

The metal frame 650 withstands pulling and twisting forces that are applied to the puck assembly 102 and/or base assembly 104, particularly when the anchoring tether 304 is placed under tension and/or when the tether 110 is placed under tension. For example, when a pulling force is applied to the puck assembly 102, there will be a tendency for the tether assembly 700 to move upward and break out of the base assembly 104 if the pulling force is sufficiently strong. Metal frame 650 helps to prevent dislocation of the tether assembly 700 from the base assembly 104 by bearing a portion of the pulling force, thereby preventing the base assembly from breaking under the pulling force.

Holder 604 may also include threaded inserts 618 that can be embedded in or molded into the towers of holder 604. The threaded inserts 618 can be brass threaded inserts. In other implementations, the threaded inserts 618 may be made of another conductive material, such as copper. As shown in the cross-sectional view of FIG. 6H and shown in sectional cut-away of FIG. 6G, each tower of the holder 604 receives a conductive metal fastener 622 that can be used to secure the ECA interface 626 to the bottom of the holder 604. The opposite end of the conductive metal fastener 622 is threaded to engage a bottom portion of the threaded insert 618. The conductive metal fastener 622 is a positive or negative terminal for the supply voltage. The conductive metal fastener 622 located within one tower can contact the ECA interface 626 with a pad of a positive terminal and carries the positive terminal connection to corresponding insert 618 (and consequently to a pad on an ECA of the riser cup 660). The conductive metal fastener 622 located within the other tower can contact the ECA interface 626 with a pad of a negative terminal and thus carry the negative terminal connection to its corresponding insert 618 (and consequently to a pad on an ECA of the riser cup 660).

Figure 6D:
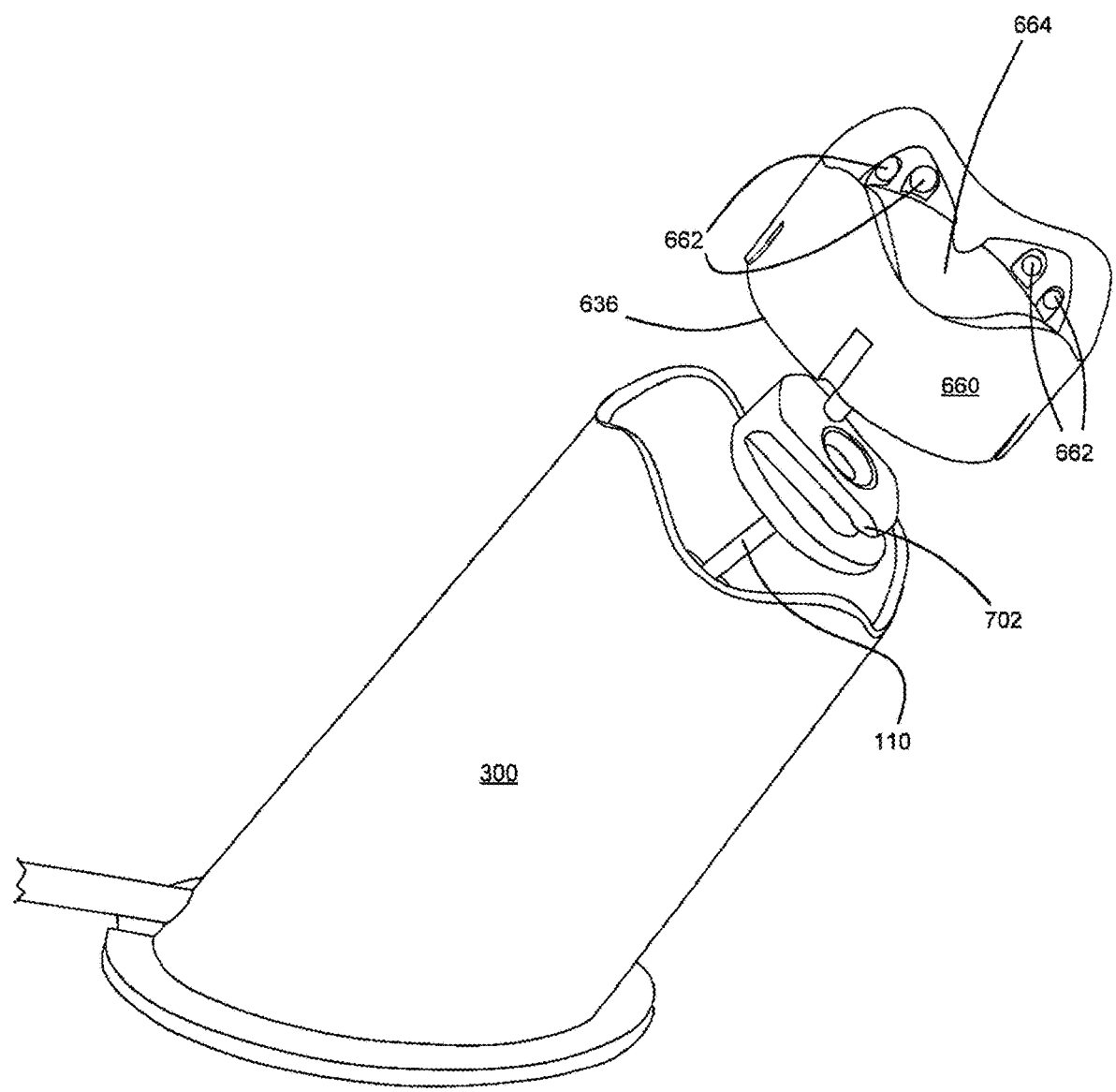
FIG. 6D shows a perspective view of the base assembly with a riser cup separated from the riser.
Figure 6E:
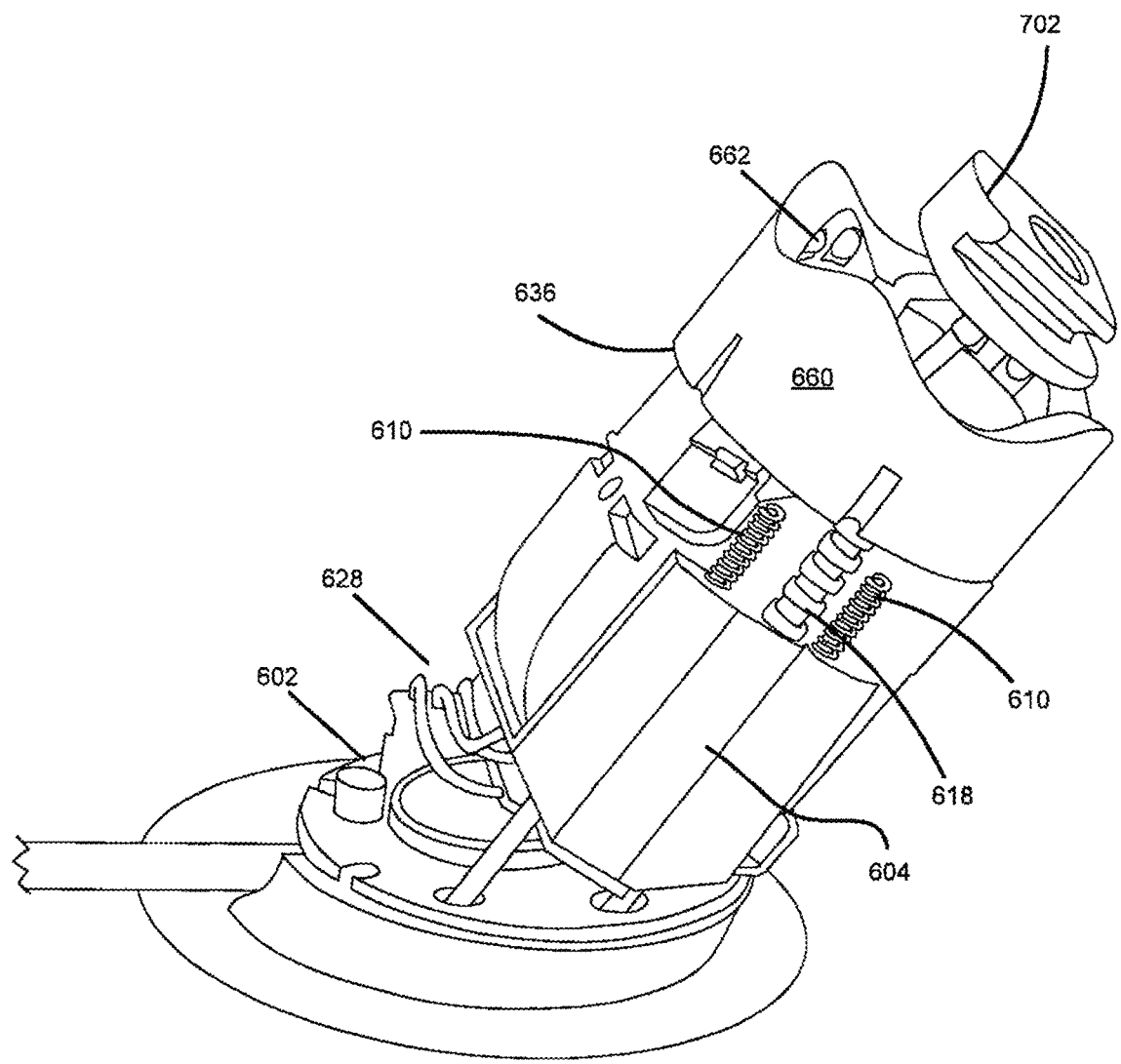
FIG. 6E shows a view of the base assembly with the riser cup inserted into the riser.
Figure 6G:
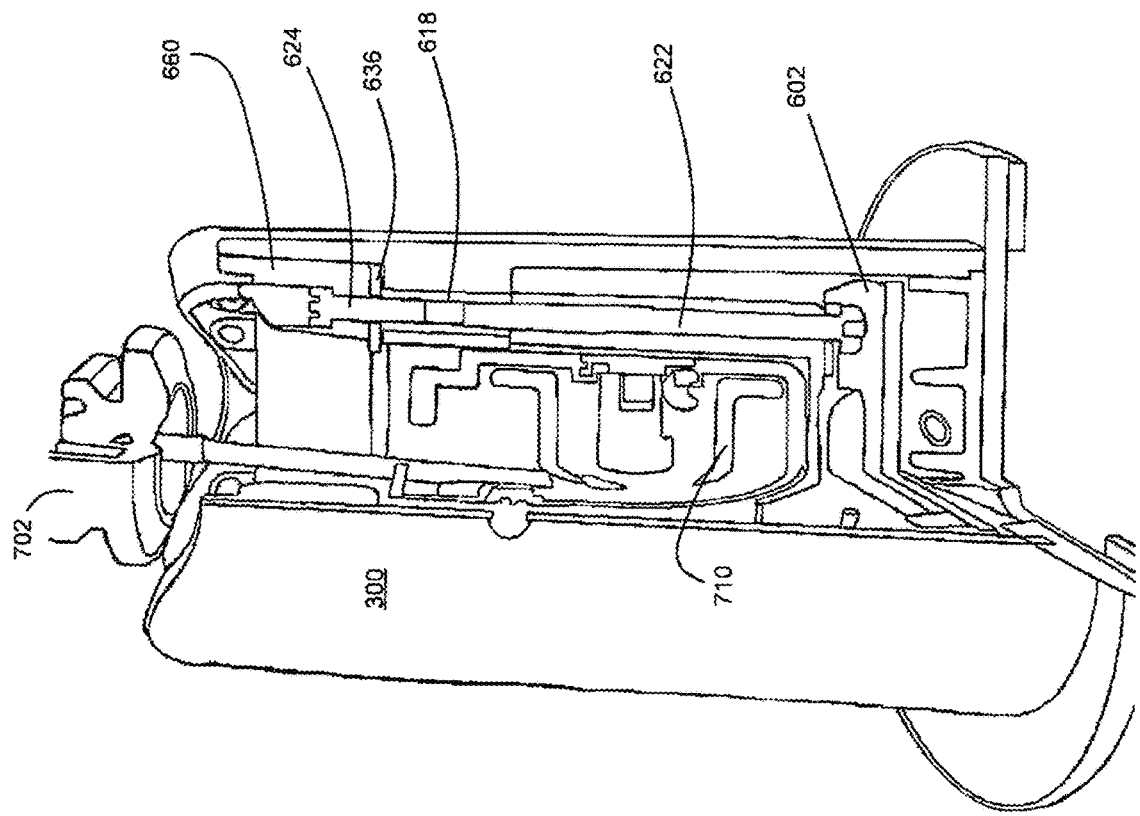
FIGS. 6F and 6G show sectional cut views of the base assembly.
Figure 6F:
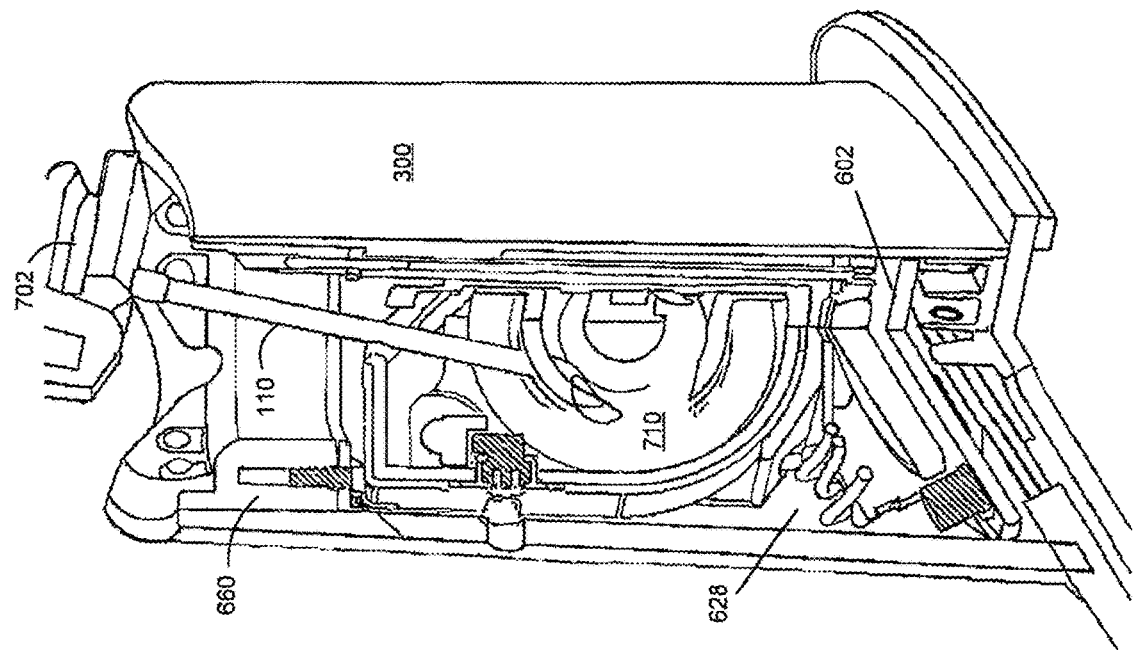
Figure 6H:
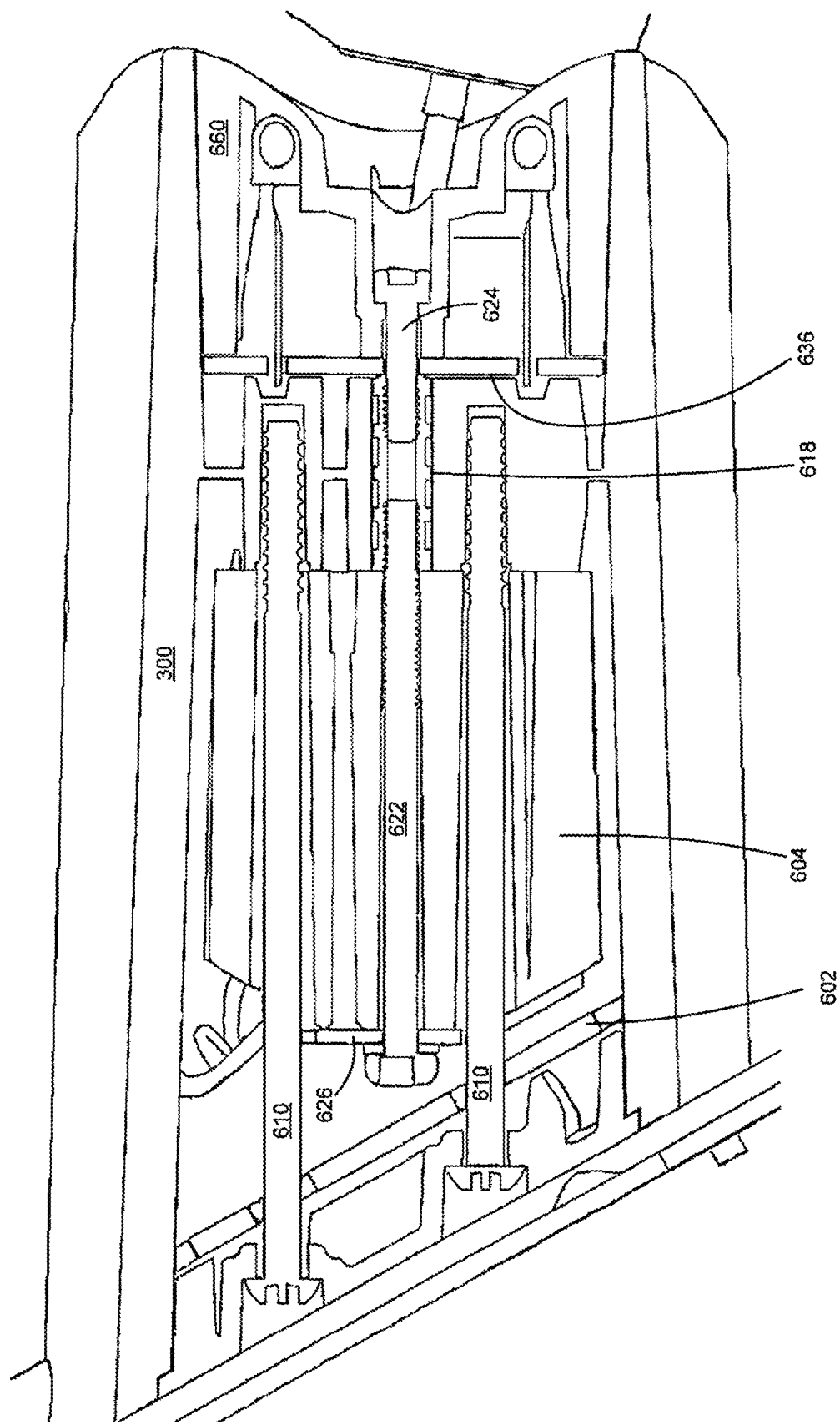
FIG. 6H shows a cross-sectional view of the base assembly.

FIG. 6D shows an exploded view of the base assembly 104 in which the riser cup 660 is located outside the riser 300. The riser cup 660 can be secured within the riser 300 via threaded inserts 618 shown in FIG. 6B. The bottom of the riser cup 660 can be an ECA/circuit board 636, which provides distribution of power from the circuit board 602 located near the base of the riser 300 in FIG. 6B to contacts 662 in the riser cup 660. The riser cup 660 can be fitted in the top of the riser 300 in alignment with inserts 618 as shown in FIG. 6E. Riser cup 660 can then be secured to riser 300 via fasteners 624 such as screws that are threaded into the upper portions of threaded inserts 618, as shown by FIGS. 6G and 6H. As noted above, a conductive path for the supply voltage can pass through conductive metal fasteners 622 to threaded inserts 618 to the ECA/circuit board 636 and then to contacts 662. Thus, as shown in FIGS. 6G and 6H, a supply voltage can be passed from circuit board 602 to a connector of the ECA assembly to the ECA interface 626 for distribution through the positive/negative terminals provided by conductive metal fasteners 622.

Also, the tether 110 may be used as part of a continuity circuit for the product display assembly 100. With such a continuity circuit, a loss in conductivity or change in another electrical characteristic that is experienced by the continuity circuit when the tether 110 is cut or otherwise broken will trigger an alarm signal. The continuity circuit can include a signal path through the tether assembly 700 to the circuit board 602. To provide a portion of this signal path, a contact 616 shown in FIG. 6B, such as a spring contact, can pass through an opening in the holder 604 to connect a conductive portion of the tether assembly 700 with the circuit board 602. The continuity circuit can utilize a conductor in the tether 110 as an AC coupled resonant antenna for detecting a cut of the tether 110.

At least a portion of the circuit board 602 can also be located inside the metal frame recess 652 in order to better protect the circuit board 602. An example is shown by FIG. 6B where most of the circuit board 602 as well as one or more connectors for the circuit board 602 are included within the metal frame recess 652 below the holder 604. Fasteners 614 (e.g., screws) can be used to secure the circuit board 602 to the base plate 380. Circuit board 602 may provide power distribution from power source 370 to the base assembly 104 and puck assembly 102 (e.g., via charge contacts), security (via alarming signals if alarm conditions are met), and data communication functionality. Examples of circuits and functionality that can be implemented by circuit board 602 are described in the above-referenced and incorporated patents and patent applications.

Figure 7A:
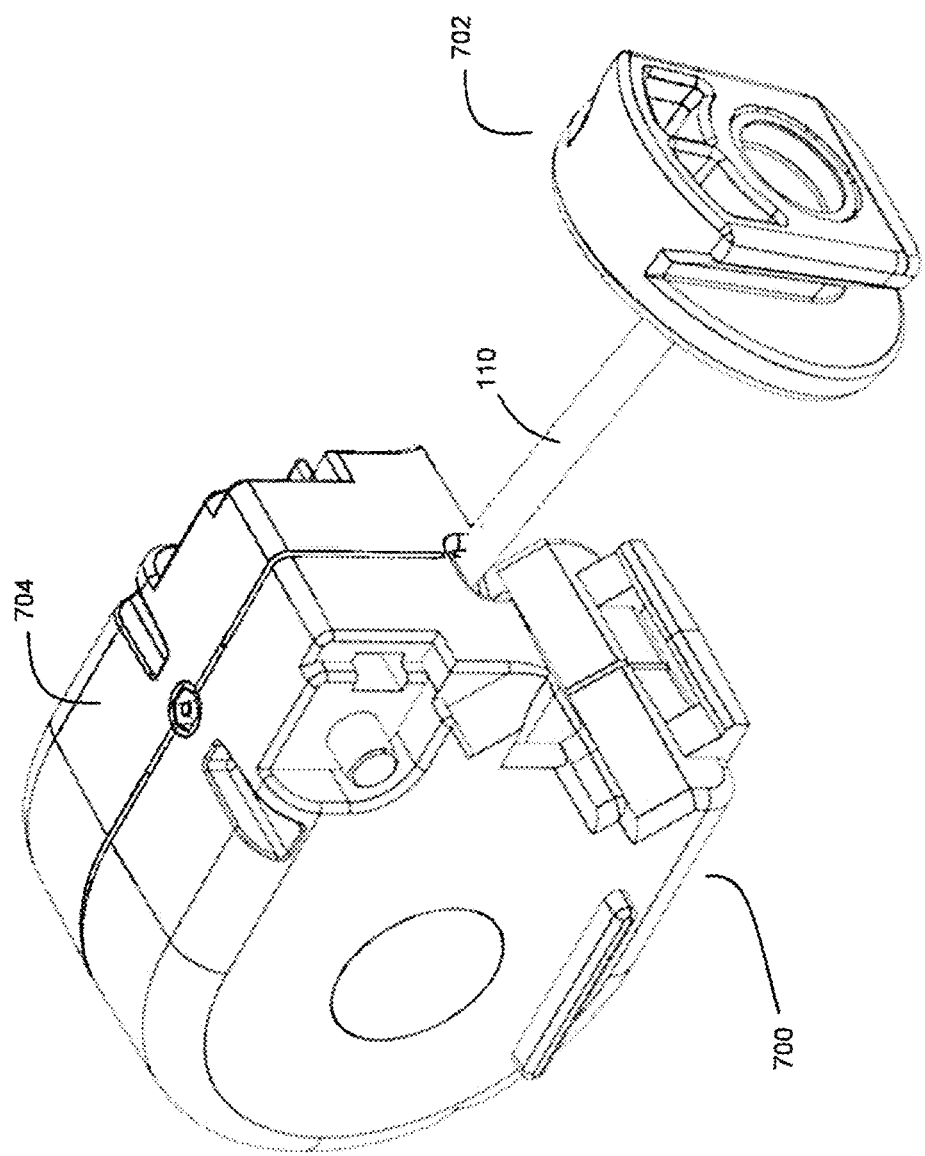
FIG. 7A shows an example tether assembly.
Figure 7B:
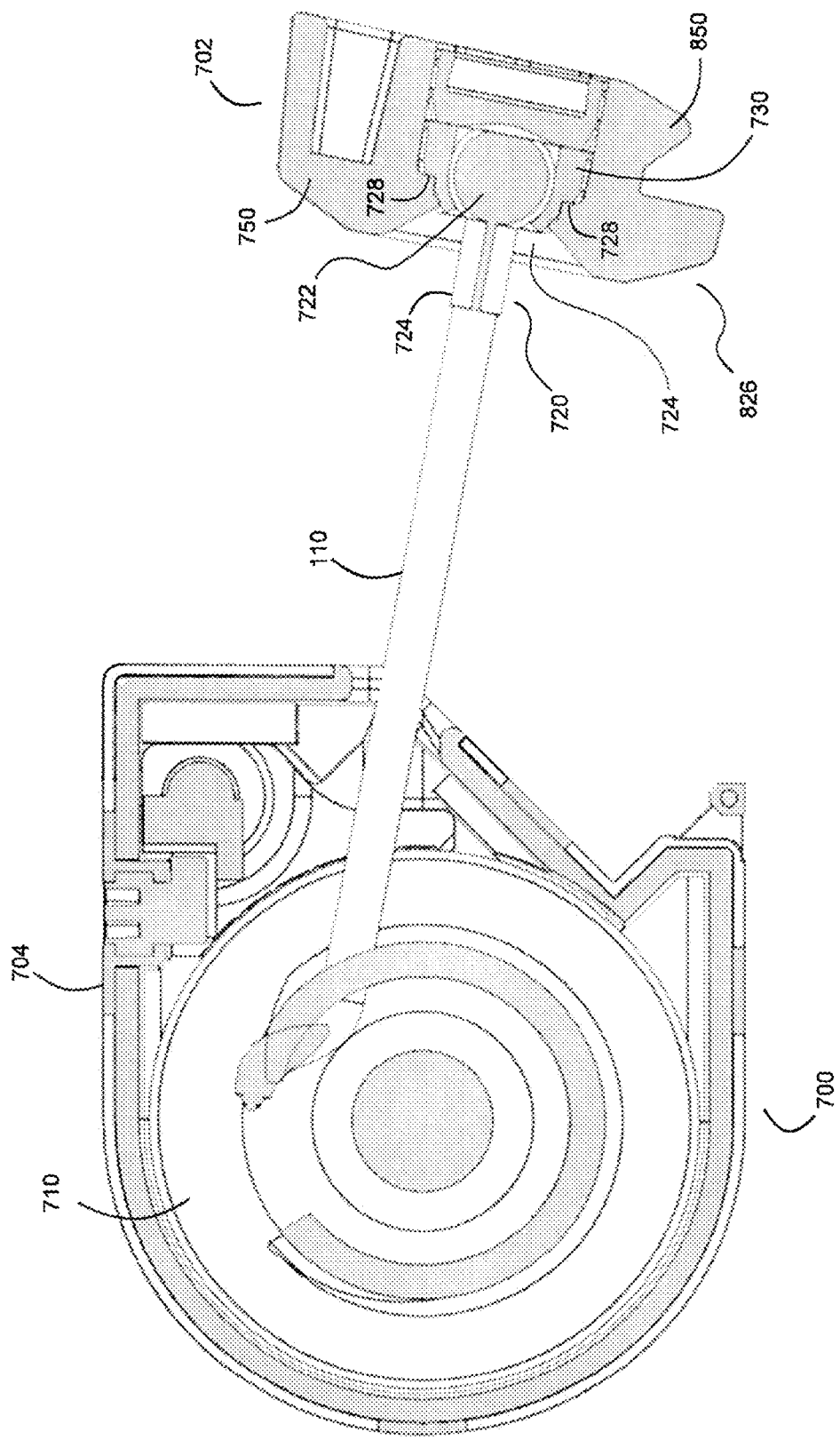
FIG. 7B is a cross-sectional view of the tether assembly and a puck fitting of FIG. 7A.
Figure 7D:
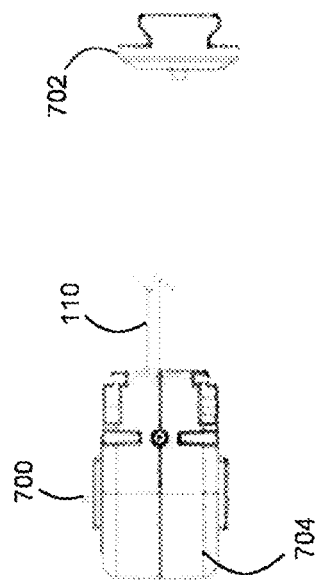
FIG. 7D is a top view of the tether assembly shown in FIG. 7A.
Figure 7C:
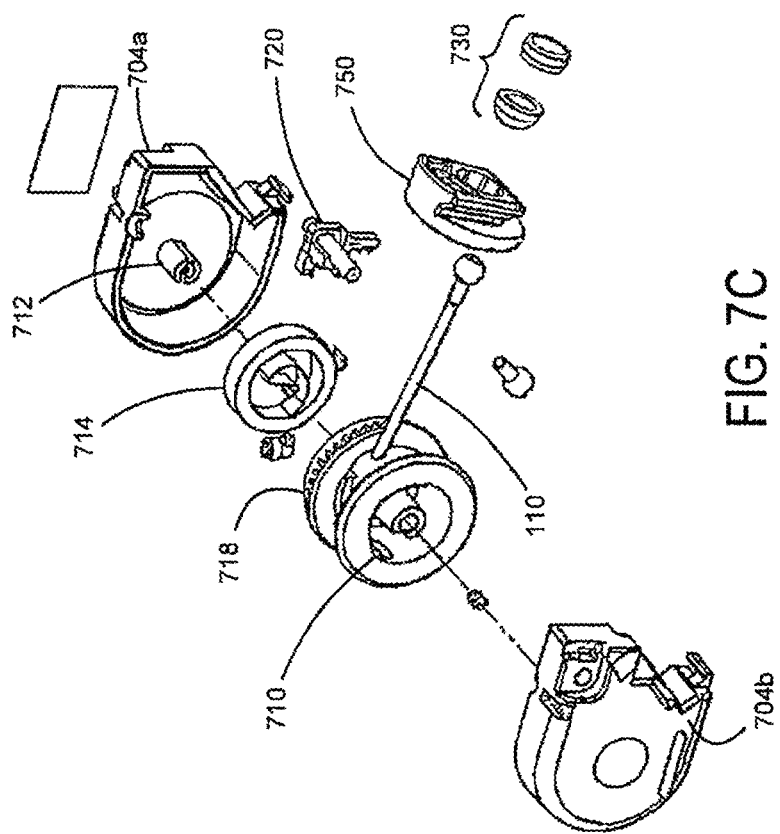
FIG. 7C is an exploded view of the tether assembly of FIG. 7A.

FIG. 7A shows an example tether assembly 700 that can be used to tether the puck assembly 102. FIG. 7B shows a cross-sectional view of the tether assembly 700 of FIG. 7A. FIG. 7C shows an exploded view of the tether assembly 700 of FIG. 7A. FIG. 7D shows a top view of the tether assembly 700. The tether assembly 700 includes a rotatable reel 710 around which the tether 110 can be wound and unwound to provide a tether 110 that can be extended and retracted. A reel housing 704 may at least partially enclose the reel 710. As shown in FIG. 7C, the reel housing 704 may include reel housing portions 704a and 704b that can be attached to each other, such as via ultrasonic welding. The reel 710 may rotate around a spindle 712 that may extend from an interior surface of the reel housing 704. The reel housing 704 may also enclose a spring 714 that biases the reel 710 and tether 110 to return to a retracted position in the absence of a pulling force on the tether 110. The reel 710 may be placed in lock position to prevent rotation. Teeth 718 can be included to engage portions of a locking mechanism 720, where locking mechanism 720 can be actuated to switch between a locked state and an unlocked state for the reel 710. When locked, the reel 710 is blocked from rotating to prevent extension of the tether 110.

One end of the tether 110 terminates at the rotatable reel 710 while the opposite end of the tether 110 terminates at a puck fitting 702 for detachable connection with the puck assembly 102. Fitting 702 can rotate around the end of the tether 110 to permit the puck assembly 102 to be freely rotated when connected to the fitting 702 and in the lift position relative to the base assembly 104.

The puck fitting 702 can permit a quick connection to and quick disconnection from the puck assembly 102. To provide such quick connect/disconnect, the fitting 702 can include a dovetail component 750 shaped to include tongues and grooves that engage corresponding tongues and grooves of the puck assembly 102 until a latch 906 on the puck assembly 102 (discussed below) latches onto the fitting 702 via aperture 742 as shown with reference to FIGS. 9B-9E.

Figure 11A:
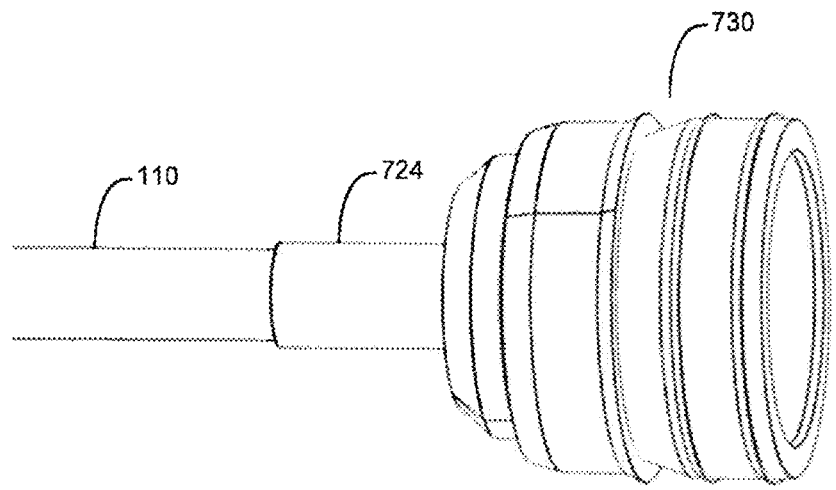
FIG. 11A shows an example rotatable ferrule connected to a tether head portion.
Figure 11B:
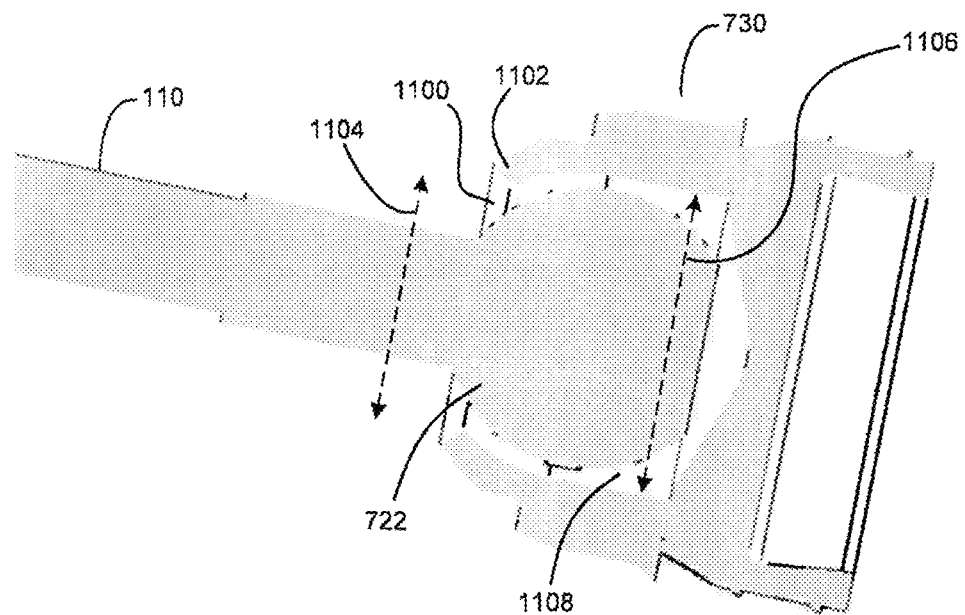
FIG. 11B shows a cross-sectional view of the rotatable ferrule of FIG. 11A.

A rotatable ferrule 730 can be connected to the tether head portion 722 as shown in FIGS. 11A and 11B. Ferrule 730 may also be formed from a metal such as steel or similar materials that would provide corrosion resistance properties while still sufficiently strong and rigid to resist deformity in the face of high tensile forces.

Figure 8A:
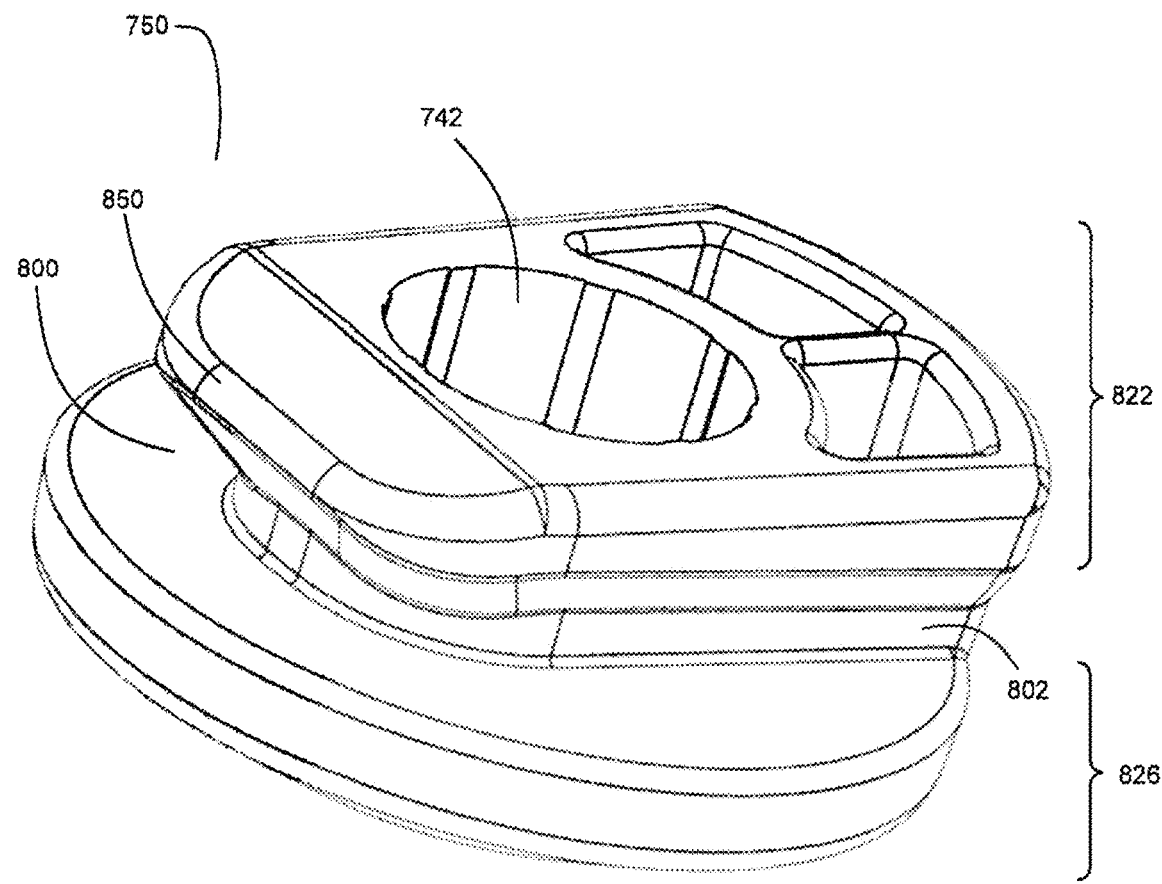

FIG. 8A shows the dovetail component 750 of the fitting 702. As shown by FIG. 8A, the tongues and grooves of the dovetail component 750 is defined by shoulder 826, neck 802, and chin 850 which together define a recess 800 for fitting elements of a collar 900 on the puck assembly 102 discussed below. FIG. 8A further shows that shoulder 826 can be included as part of a lower portion of the dovetail component 750, while chin 850 is part of a portion 822 of the dovetail component 750. Chin 850 has a sloped outer edge that provides a wedging action when inserted into metal collar 900 of the puck assembly 102. as described below and shown with reference to FIGS. 9B-9E. Aperture 742 can extends through the dovetail component 750 to receive ferrule 730 as discussed below with reference to FIG. 7B. A tool can be used to actuate one or more springs for disengaging the latched connection to trigger a quick disconnect.

Figure 8B:
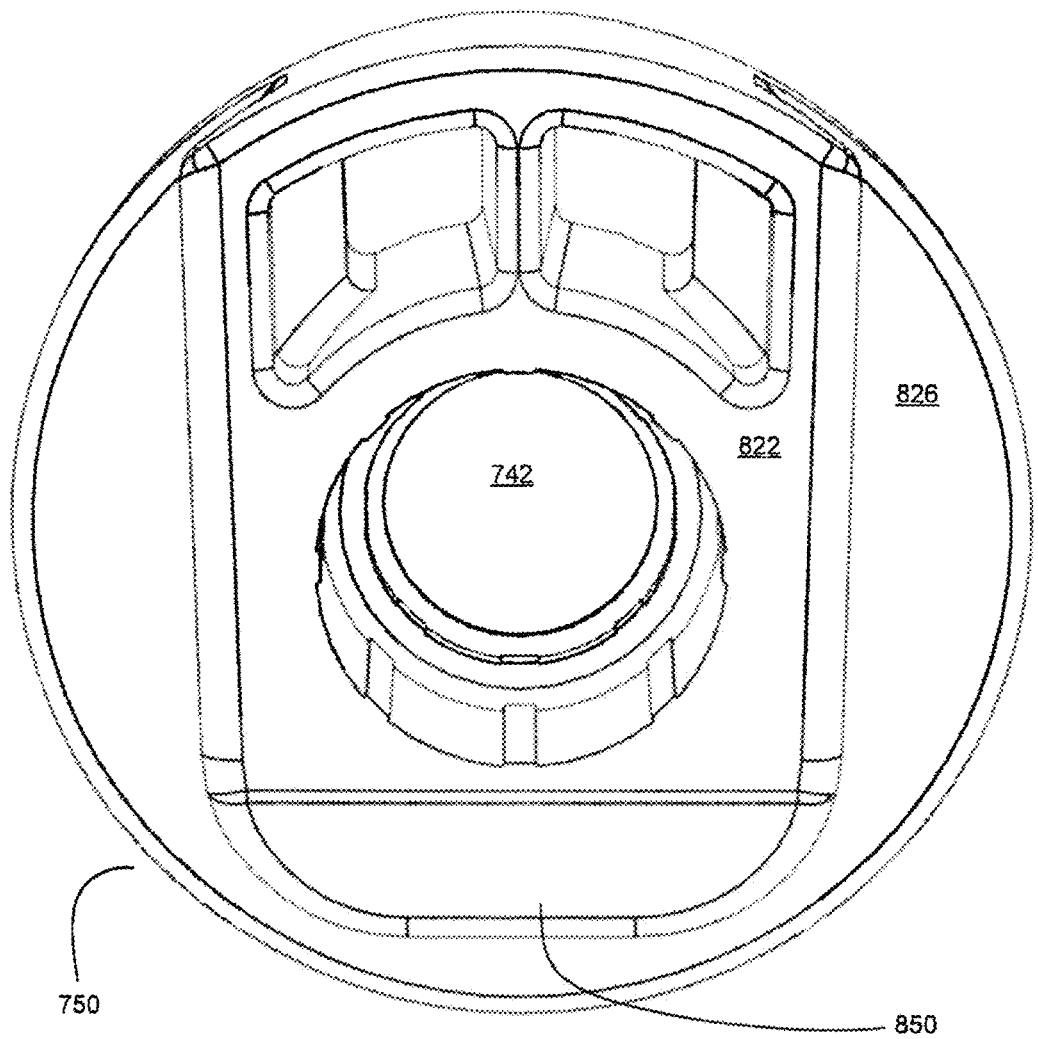
Figure 8C:
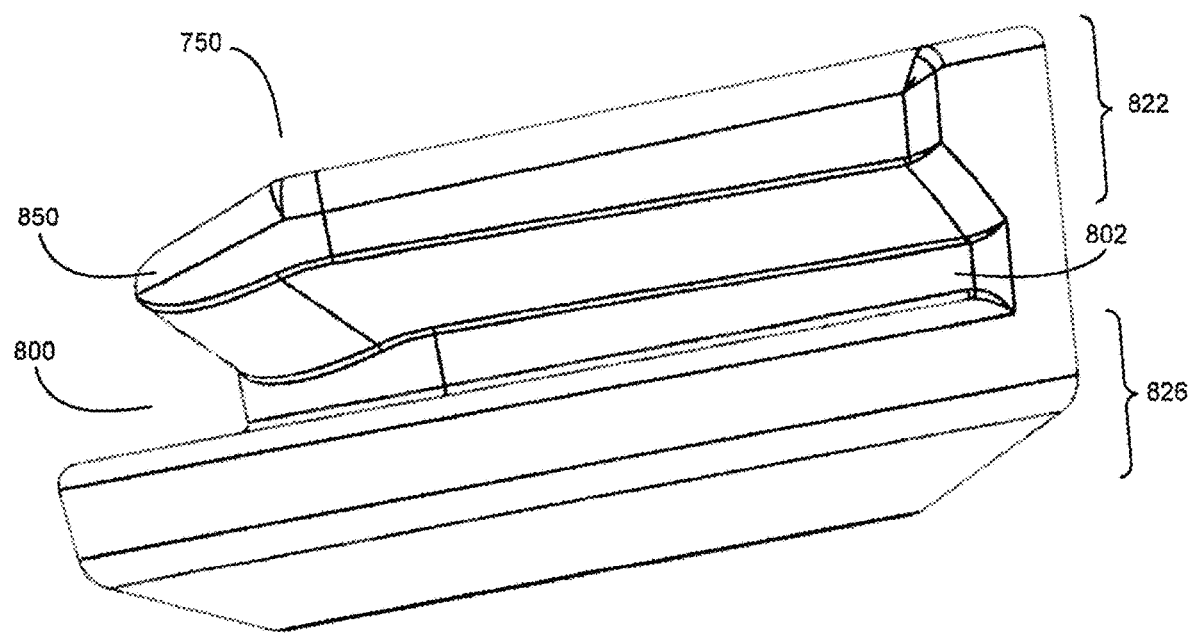
Figure 8D:
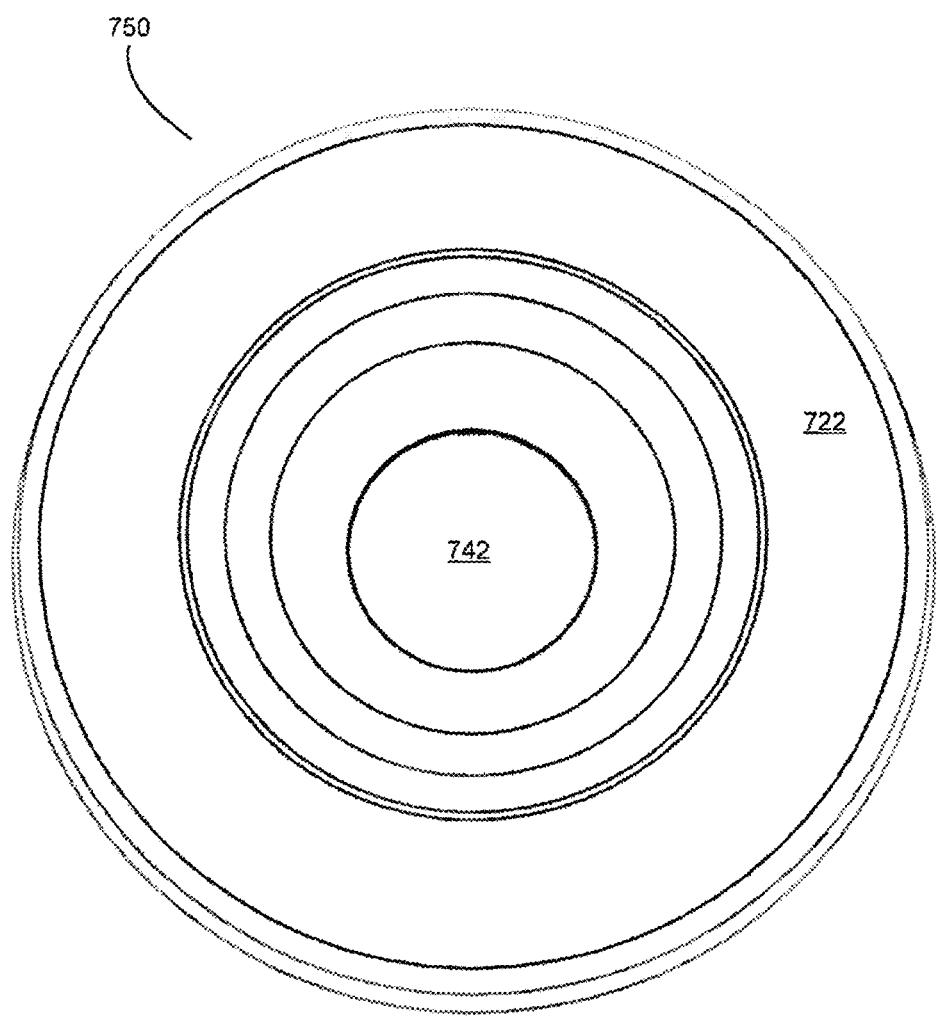

FIG. 8B shows a top view of the dovetail component 750 of FIG. 7A. FIG. 8C shows a side view of the dovetail component 750. FIG. 8D shows a bottom view of dovetail component 750. FIG. 8E shows a cross-sectional view of the dovetail component 750, where cavity 740 inside the dovetail component 750 which can be accessed via aperture 742.

Figure 9A:
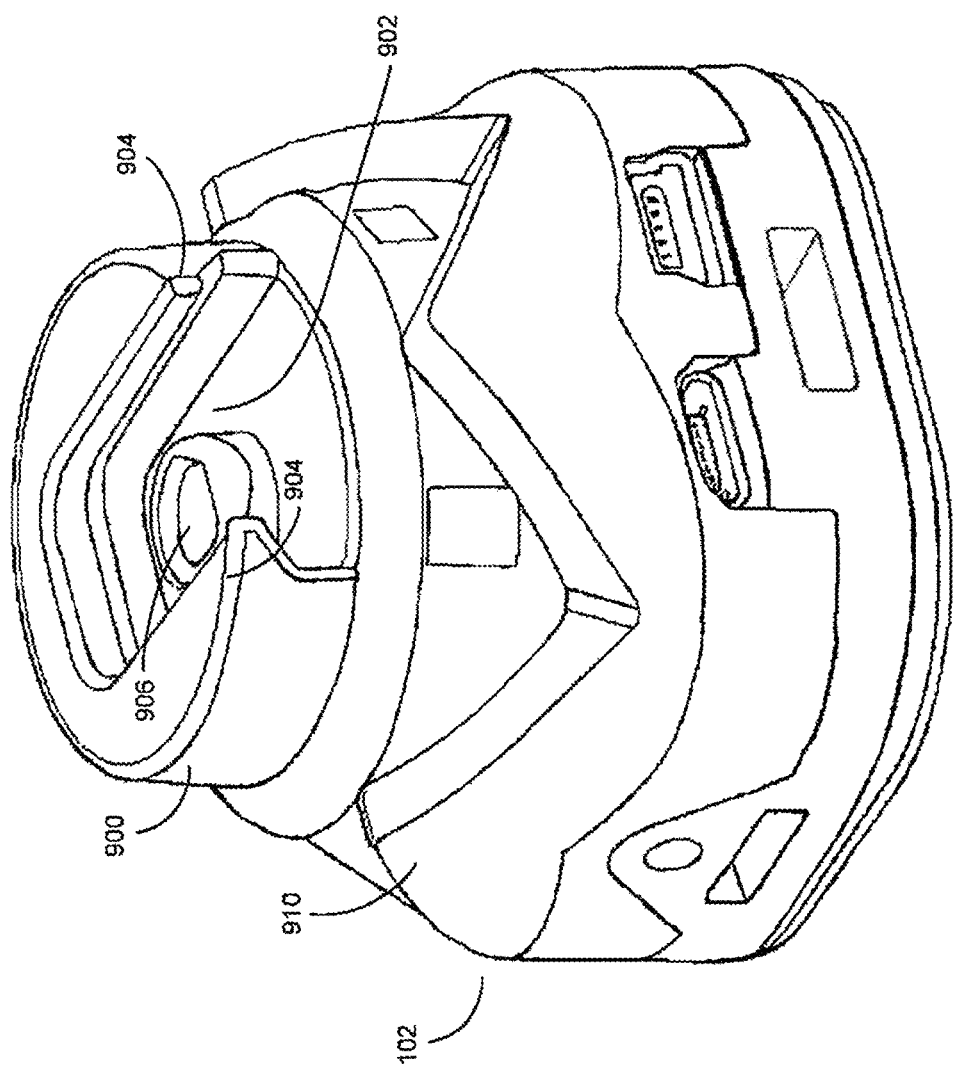
FIG. 9A shows an example puck assembly for connection with the puck fitting of FIG. 8A.

As an improvement over previous designs for connecting rotatable fittings 702 with puck assemblies 102. the puck assembly 102 can include a metal collar 900 that strengthens the latching between the puck assembly 102 and puck fitting 702. FIG. 9A shows a bottom perspective view of an example puck assembly 102 to reveal a metal collar 900. Metal collar 900 may be formed from a metal such as steel or other suitable material that provides sufficient strength and rigidity for resisting brute force attacks that may place the connection between fitting 702 and puck assembly 102 under high tension. Because the metal collar 900 lies in the force stack/chain for the product display assembly 100, the resilience of the product display assembly 100 with respect to withstanding brute force attacks where the puck assembly 102 experiences strong pulling forces is greatly improved through the use of metal as the material for the collar 900. The dovetail component 750 may be made of a durable plastic material. Because dovetail component 750 is expected to be handled by the hands/fingers of customers as they lift the puck assembly 102, the dovetail component 750 (or at least an outer surface thereof) may be made of plastic or another suitable non-conductive material. For example, the risk of false positive tether cuts can be reduced because the capacitance of the human body will have less of an impact on the continuity signal given the insulation provided by the plastic or non-conductive material of the dovetail component 750.

FIG. 9A also shows the metal collar 900 attached to a bottom portion of the body 910 of puck assembly 102. Due to the inverted nature of the puck assembly 102 of FIG. 9A, the metal collar 900 is shown toward the top of FIG. 9A. FIG. 9A further shows how metal collar 900 can be shaped to receive fitting 702. The metal collar 900 shown in FIG. 9A includes a rim 904 for the collar 900 that wraps around a recess 902 that receives neck 802 and chin 850 of the dovetail component 750. Shoulder 826 of the dovetail component 750 can then slide across the surface of the metal collar 900 as the fitting 702 is coupled with the metal collar 900. A latch 906 is located within recess 902. The latch 906 is vertically displaced by chin 850 when fitting 702 is slid into recess 902. As fitting 702 slides into recess 902, the cavity 740 of the fitting 702 is aligned with the latch 906, whereupon the latch 906 springs back into place, thereby latching onto the fitting 702.

Figure 9C:
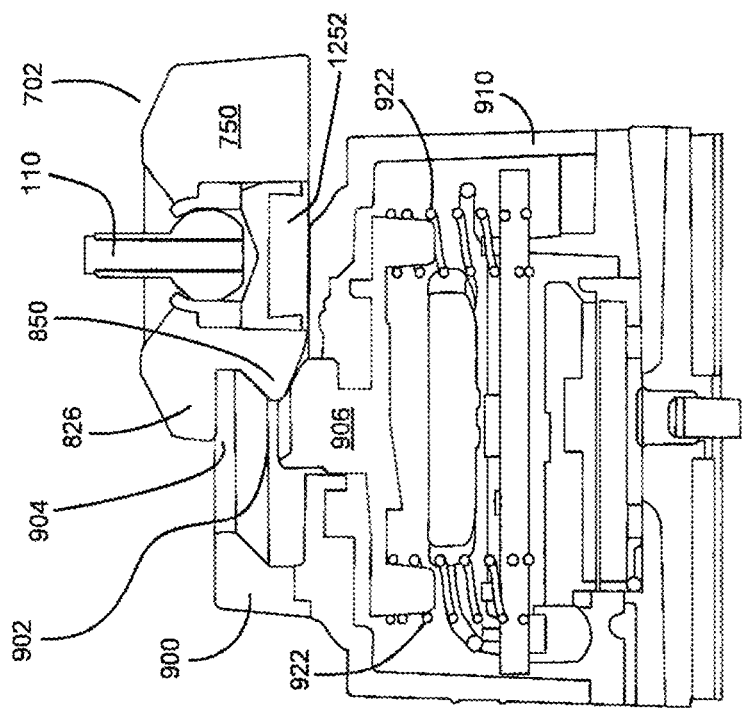
FIGS. 9B-9E show snapshots of different stages of the puck fitting being coupled with a metal collar of the puck assembly of FIG. 9A.
Figure 9B:
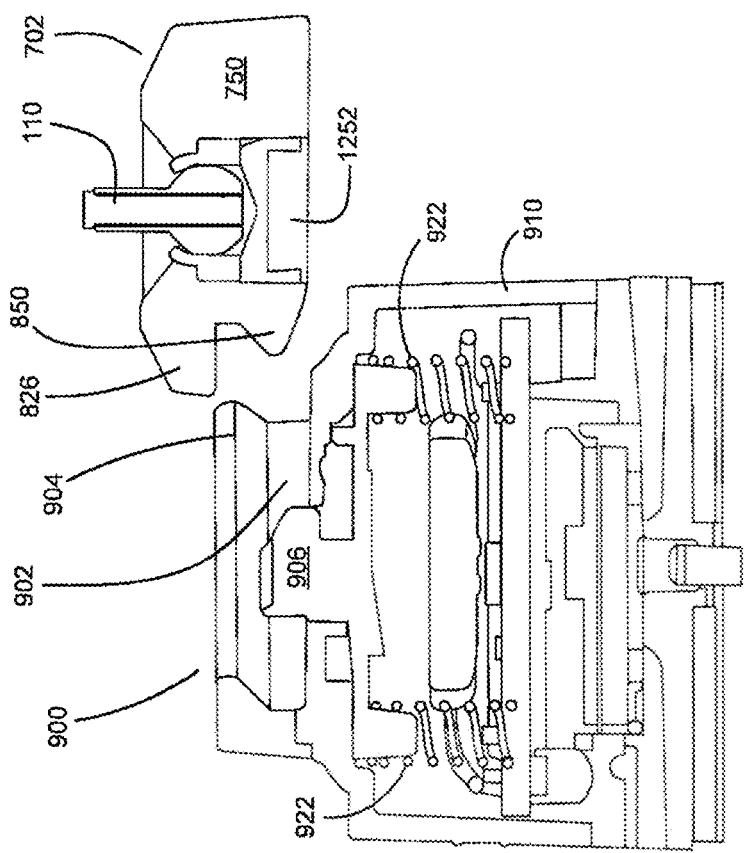
Figure 9E:
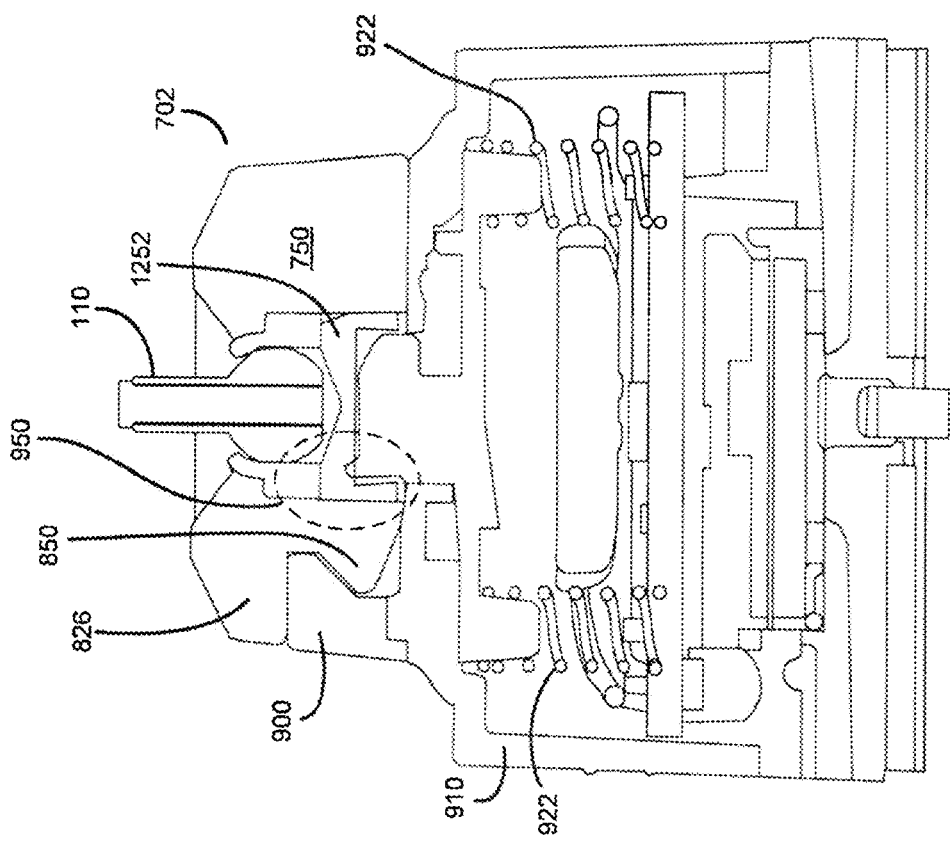
Figure 9D:
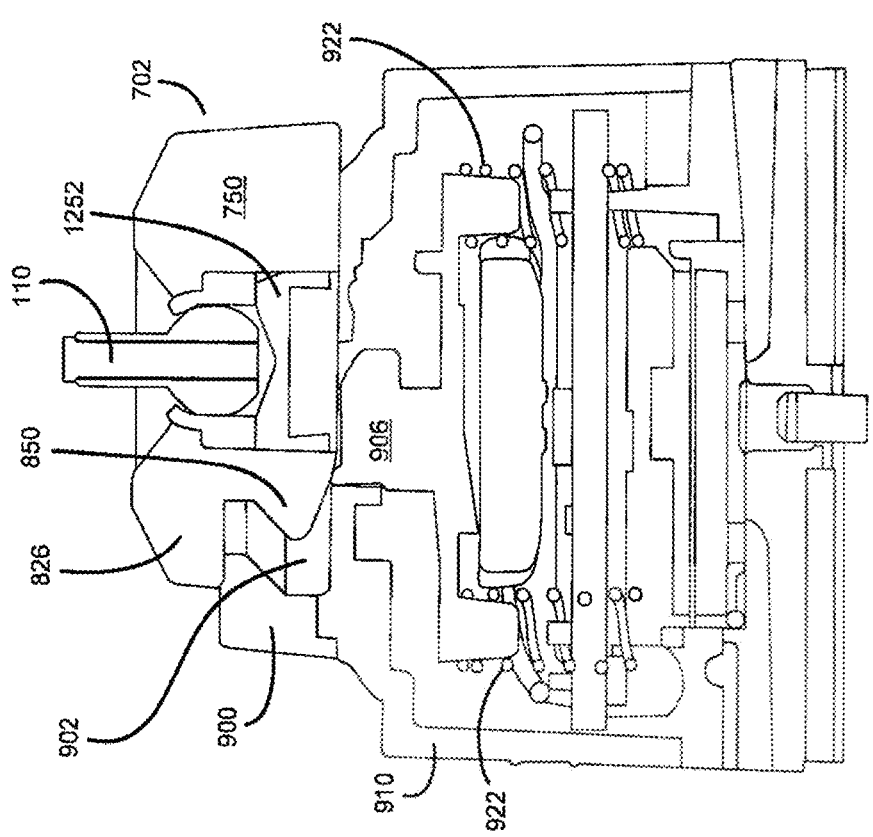

FIGS. 9B-9E show snapshots of different stages of the fitting 702 being coupled with the metal collar 900. FIG. 9B shows the fitting 702 aligned with the recess 902 of the metal collar 900 before coupling of the fitting 702 with the metal collar 900. FIG. 9C shows the fitting 702 after it has been partially slid into the recess 902. While latch 906 is normally biased by springs 922 into a position where it extends into the recess 902 as shown in FIG. 9B, sliding the fitting 702 into the recess 902 forces the chin against the latch 906 which in turn pushes the latch 906 downward to compress springs 922 as shown in FIG. 9C. Meanwhile, rim 904 begins collaring neck 802 with shoulder 826 sliding across the surface of the metal collar 900. FIG. 9D shows the fitting 702 slid further into the recess 902 where the cavity 740 (see FIG. 8E) of the fitting 702 and the upper ferrule 1252 (see FIGS. 12B and 12C) are nearly aligned with the latch 906. FIG. 9E shows the fitting 702 after it has been fully inserted into the recess 902, where the latch 906 is aligned with the recess of upper ferrule 1252 so that springs 922 can return latch 906 to an extended position, providing a latching action that locks the puck assembly 102 onto the tether 110 via the metal collar 900 and the fitting 702. With latch 906 in its extended position, the fitting 702 cannot be reverse slid out of the collar 900 because latch 906 blocks the path of the fitting 702 out of the recess 902.

Figure 9F:
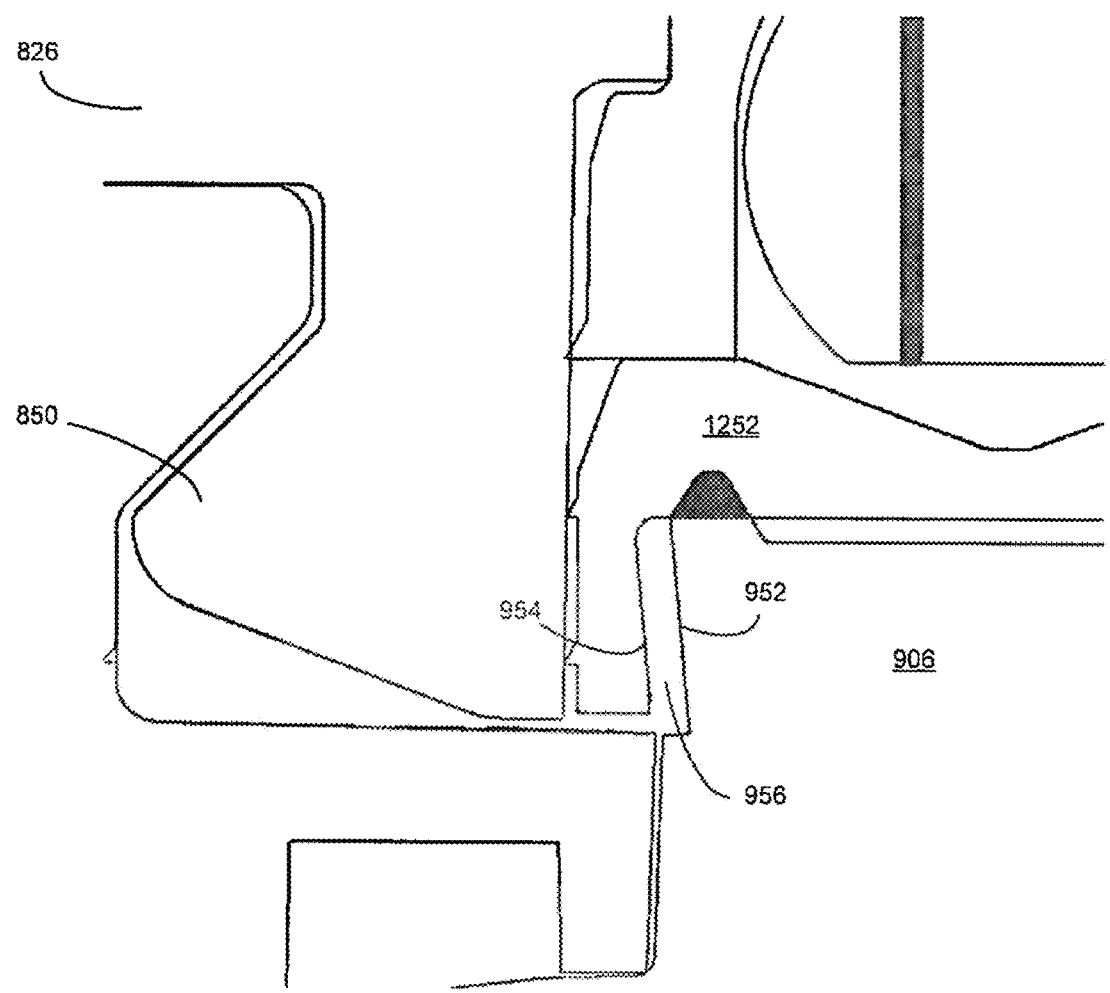
FIG. 9F shows a magnified view of puck fitting inserted into the metal collar.

FIG. 9F shows a magnified view of the area generally illustrated by circle 950 of FIG. 9E. To enhance the mechanical engagement between latch 906 and upper ferrule 1252, the engaging portions of the latch 906 and upper ferrule 1252 can be sloped to provide a French cleat action that maintains the integrity of the engagement to resist pushing latch 906 inward against the bias force of the springs 922 as forces are applied in an attempt to separate the fitting 702 from the metal collar 900. As shown in FIG. 9F, the inner wall 954 of the recess 956 of the upper ferrule 1252 is angled so that the diameter of the recess 956 widens with depth. The outer wall of latch 906 is angled so that latch 906 widens to fit within the upper ferrule 1252.

Returning to FIG. 7B, the fitting 702 is connected to the tether 110. Tether end portion 720 may include a tether head portion 722 that has a wider diameter than the axially extended length of the tether 110. Tether head portion 722 may be formed from a metal such as steel. For example, stainless steel such as 316 grade stainless steel can be used for tether head portion 722. However, any material that provides electrical conductivity for passing the cut detect continuity/resonance signal and which provides suitability strength, corrosion resistance, and low wear properties may be employed.

Figure 10A:
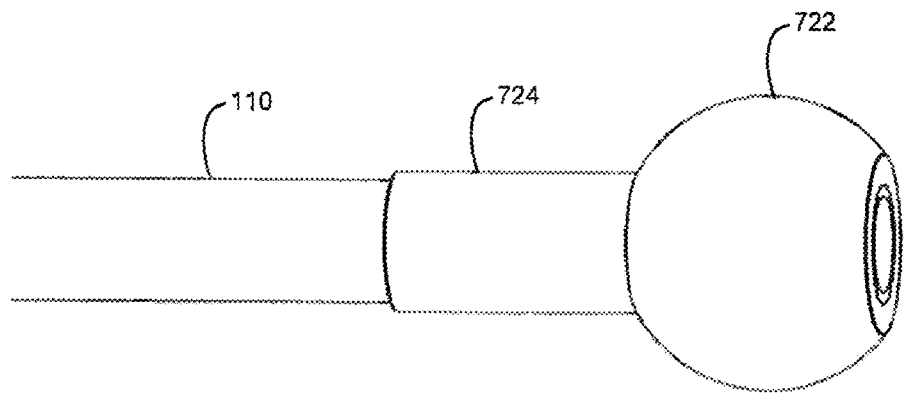
FIG. 10A shows an example tether head portion at an end of a tether.
Figure 10B:
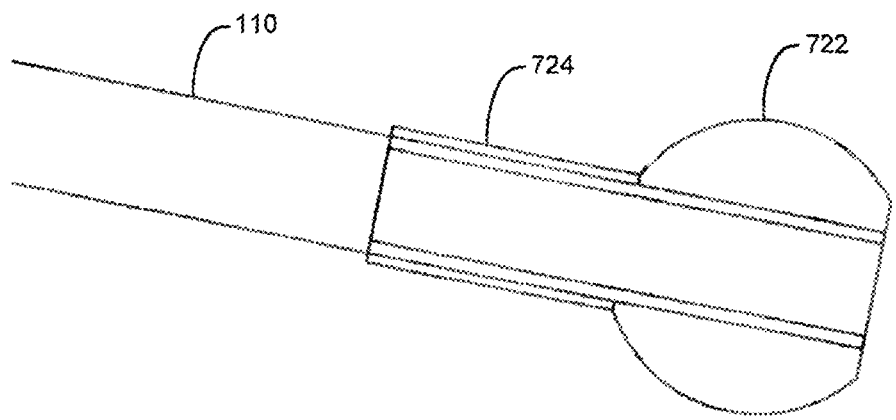
FIG. 10B shows a cross-sectional view of the tether head portion of FIG. 10A.

FIGS. 10A and 10B show enlarged isometric and cross-sectional views, respectively, of the tether head portion 722. The tether head portion 722 has a wider diameter than the diameter of the tether 110. The tether head portion 722 has a central cavity through which the tether 110 extends and a crimp structure 724 secure this connection between the tether 110 and the tether head portion 722. The tether head portion 722 can be connected to the tether 110 by compression under high force to obtain the ball shape of the tether head portion 722. The process is repeated after rotating the tether head portion 722 so the ball shape is uniform. The material can be repeatedly compressed into the wire strands of the tether 110 to create a high tension force when pulled axially. The tether head portion 722 need not be spherical. For example. the tether head portion 722 has a flat plane surface, as shown by FIGS. 10A and 10B.

Figure 12A:
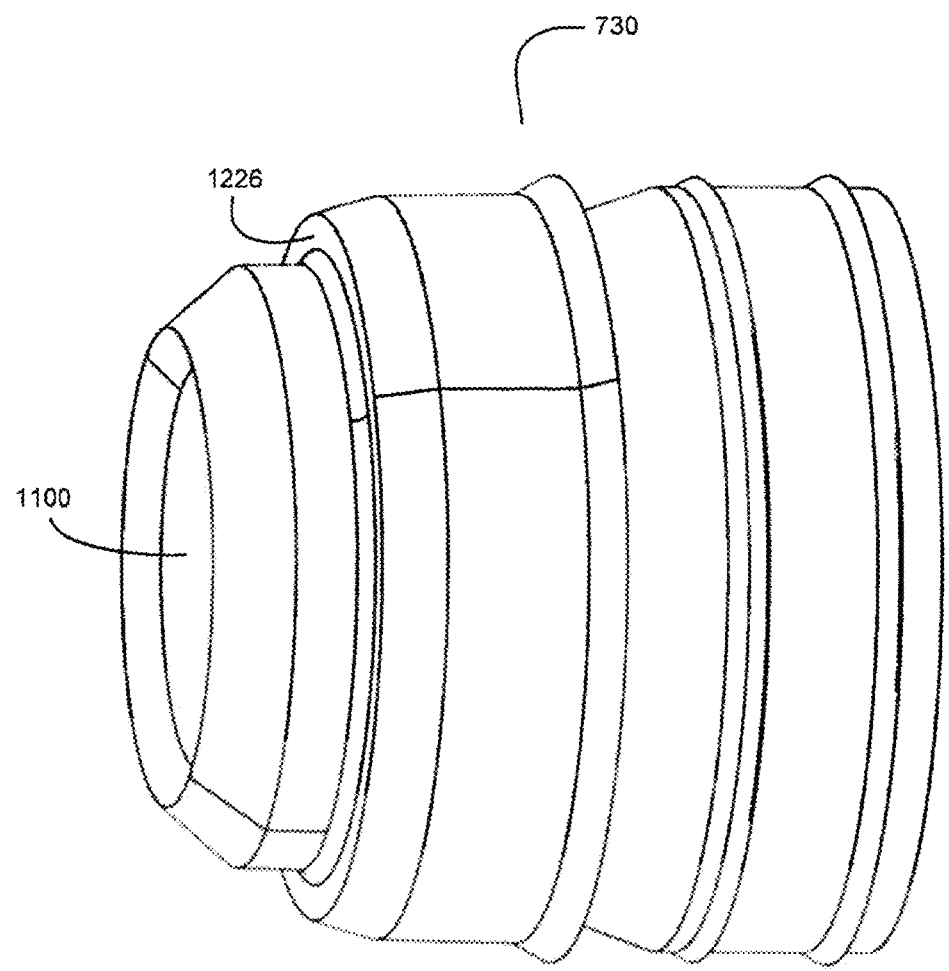
FIG. 12A shows a perspective view of an example rotatable ferrule.
Figure 12B:
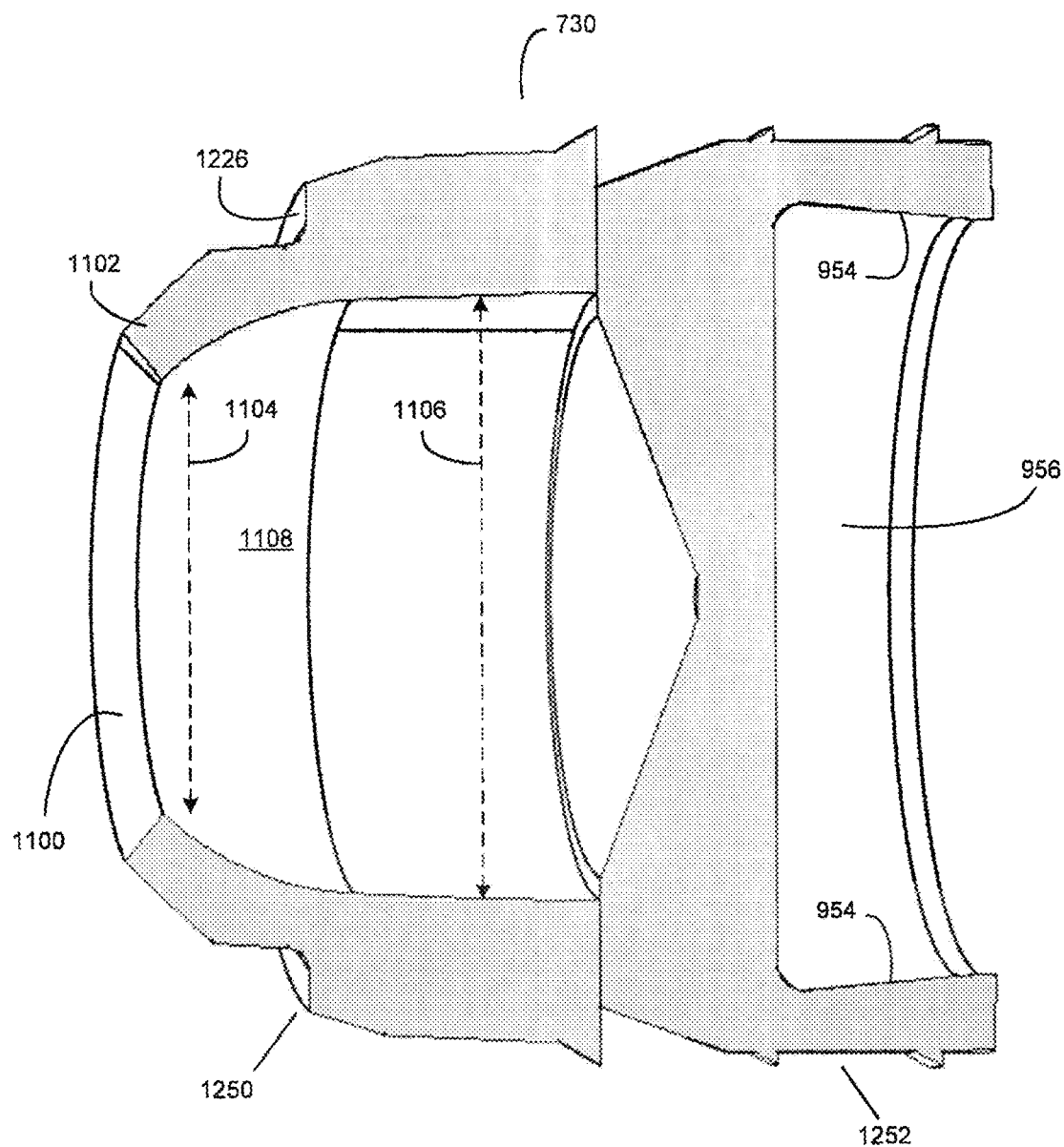
FIG. 12B shows a cross-sectional view of the rotatable ferrule of FIG. 12A.

As shown by FIGS. 11A, 11B, 12A, and 12B, ferrule 730 can include a central aperture 1100 in its lower portion and a central cavity 1108 in which the tether head portion 722 can be located, and where the ferrule 730 is rotatable around the tether head portion 722. As shown by FIG. 11B and 12B, aperture 1100 can be defined by ferrule lips 1102 so that a width 1104 of the aperture 1100 is narrower than a width 1106 of a cavity 1108. Accordingly, tether head portion 722 can be retained inside the cavity 1108 by lips 1102 to prevent disconnection of the tether 110 from the ferrule 730, while still permitting the ferrule to freely rotate around the tether head portion 722 and the tether 110. Furthermore, aperture 1100 with respect to width 1104 also affords the ability of the puck assembly 102 to not only swivel but also tilt, pivot within a suitable range for a less restrictive user experience when lifting the puck assembly 102 to handle the product merchandised thereon.

The ferrule 730 can be inserted into a cavity 740 of the fitting 702 (see FIG. 8E) to create a connection between the fitting 702 and tether 110. To support this connection, the cavity 740 of the fitting 702 includes a fitting shoulder 728 that extends inwardly from the wall of the cavity 740 to engage with a ferrule shoulder 1226 in FIGS. 12A, 12B, and 12C. Accordingly, tether 110 can extend through fitting aperture 742 while ferrule 730 is located inside cavity 740. Fitting shoulder 728 can engage with ferrule shoulder 1226 to prevent disconnection of the tether 110 and connected ferrule 730 from the fitting 702.

Figure 12C:
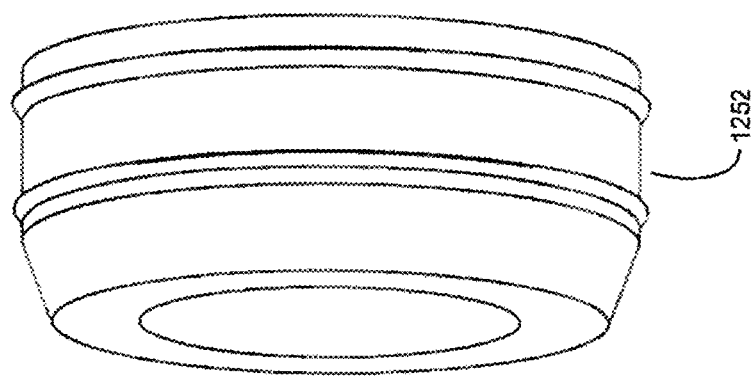
FIG. 12C shows an exploded view the rotatable ferrule of FIG. 12A.
Figure 12C:
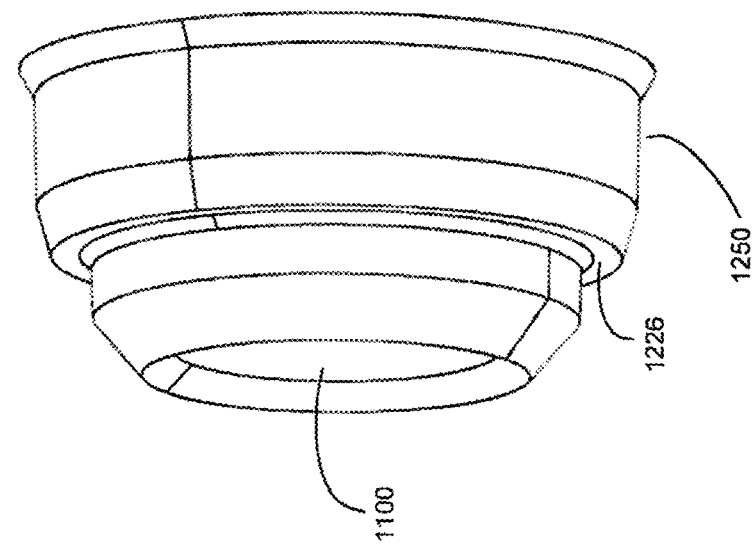

In an example embodiment, the ferrule 730 can be comprised of a lower ferrule 1250 and an upper ferrule 1252 as shown by FIGS. 12B and 12C. The upper ferrule 1252 can serve any of a number of purposes. For example, the upper ferrule 1252 may prevent the tether head portion 722 and tether 110 from protruding above the body of puck fitting 702. The upper ferrule 1252 can also provide a uniform metal surface for a conductive connection between the latch 906 in the puck assembly 102 and the tether head portion 722 and the tether 110. This conductivity can be part of the continuity circuit for cut detection signaling. The upper ferrule 1252 can also provide the sloped surface 954 for enhancing the mechanical engagement of the latch 906 to the fitting 702 via French cleat interaction as described above.

To connect the tether 110 to the fitting 702 via ferrule 730, the following sequence of steps can be performed. The tether head portion 722 is swaged onto the tether 110. The ferrule 730 is then pressed into the fitting 702. The non-swaged end of the tether 110 is fed through the ferrule 730 such that tether head portion 722 rests in the ferrule's recess. The upper ferrule 1252 is then pressed into the recess to close the assembly. Thus, the force stack/chain for the product display assembly 100 can include engagement of the tether head portion 722 against ferrule lips 1102, engagement of the ferrule shoulder 1226 against fitting shoulder 728, and engagement of the fitting notch region 800 with a corresponding metal collar 900 of the puck assembly 102 when a pulling force is applied to the puck assembly to place tether 110 under tension. By forming this force stack/chain out of components with the configurations and materials described herein, the product display assembly 100 is much better suited for withstanding brute force pulling attacks on the puck assembly 102 than conventional product display assemblies.

It is appreciated that the previous description of the disclosed embodiments is provided to enable any person skilled in the art to make or use the present disclosure. Various modifications to these embodiments will be apparent to those skilled in the art. and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A system for displaying a product to customers, the system comprising:
    a puck assembly having a surface on which the product is mountable;
    an anchoring tether having a first end and a second end, the first end having a compression-fit connector and the second end is connectable to an anchor:
    a base assembly having a base plate with a retainer that holds the connector and has a recess for passage of the anchoring tether; and
    a second tether that connects the puck assembly to the base assembly.

2. The system of claim 1 wherein the retainer comprises sides walls that rise from a floor of the base plate and hold the connector and prevent dislocation of the connector from the retainer when a pulling force is applied to the second tether.

3. The system of claim 1 wherein the base plate includes a terminal that connects a power cable and enables passage of electrical power to a circuitry of the base assembly.

4. The system of claim 1 wherein the anchoring tether comprises:
    a loop formed from the anchoring tether; and a crimp structure adapted to secure the loop through which a portion of the anchor can be received to connect the anchoring tether with the anchor.

5. The system of claim 1 wherein the second tether is part of a tether assembly that comprise a reel around which the second tether is retractably windable and un-windable and the reel is located within the base assembly.

6. The system of claim 1 wherein the base assembly comprises:
an interior metal frame and an upper aperture, the metal frame including a metal frame recess; and
a tether assembly located within the metal frame recess, the tether assembly including a reel around which the second tether is retractably windable and un-windable and the reel is located within the base assembly.

7. The system of claim 1 further comprises a metal frame that includes a plurality of vertical metal members that define at least a portion of the metal frame recess.

8. The system of claim 1 wherein the base assembly runs power for delivery to the puck assembly through a plurality of conductive fasteners that connect structural elements of a riser within the base assembly to a riser cup within the base assembly and the riser cup comprises a plurality of base assembly contacts for providing power to the puck assembly via a plurality of puck assembly contacts when the puck assembly is in the rest position.

9. A system for displaying a product to customers, the system comprising:
a puck assembly having a surface on which the product is mountable for merchandising of the product to a customer,
a base assembly on which the puck assembly is restable, the base assembly including an interior metal frame, the metal frame including a plurality of metal members, a metal base plate joined to the metal members, a metal frame recess between the metal members, and an upper aperture; and
a tether assembly for connection to the puck assembly, the tether assembly including a tether and a reel around which the tether is retractably windable and un-windable, the reel located within the metal frame recess and wherein the tether is extendable through the upper aperture for connection with the puck assembly.

10. The system of claim 9 wherein the metal members extend through the metal base plate.

11. The system of claim 9 wherein the base assembly comprises a holder for the tether assembly, wherein the members extend through the holder.

12. The system of claim 9 wherein the base assembly includes a circuit board and a plurality of base assembly contacts, and the puck assembly includes a plurality of puck assembly contacts, the base assembly transfers electrical powers from the circuit board to the puck assembly via the base assembly contacts and the puck assembly contacts when the puck assembly is in a rest position, and
wherein a conductive path for the power transfer within the base assembly includes a path from the circuit board through conductive material in the holder to the base assembly contacts.

13. The system of claim 9 wherein the base assembly comprises conductive fasteners that secure a circuit board to a holder for the tether assembly.

14. The system of claim 9 wherein the base assembly comprises a riser and a riser cup secured to an upper portion of the riser and contacts of the base assembly are located in the riser cup.

15. The system of claim 9 wherein the base assembly comprises a circuit board, located within the metal frame recess.

* * * * *